(12) United States Patent
Branco et al.

(10) Patent No.: US 8,601,342 B2
(45) Date of Patent: Dec. 3, 2013

(54) EFFICIENT, PROGRAMMABLE AND SCALABLE LOW DENSITY PARITY CHECK DECODER

(75) Inventors: Richard Gerald Branco, Burlington, NJ (US); Edward Schell, Jackson, NJ (US)

(73) Assignee: Sirius XM Radio Inc., New York, NY (US)

( * ) Notice: Subject to any disclaimer, the term of this patent is extended or adjusted under 35 U.S.C. 154(b) by 1170 days.

(21) Appl. No.: 12/384,127

(22) Filed: Mar. 31, 2009

(65) Prior Publication Data

US 2010/0064199 A1 Mar. 11, 2010

Related U.S. Application Data

(60) Provisional application No. 61/072,646, filed on Mar. 31, 2008.

(51) Int. Cl.
*H03M 13/00* (2006.01)
(52) U.S. Cl.
USPC ........................................... 714/755; 714/786
(58) Field of Classification Search
USPC .................................................. 714/755, 786
See application file for complete search history.

(56) References Cited

U.S. PATENT DOCUMENTS

| | | | |
|---|---|---|---|
| 7,797,613 B1 * | 9/2010 | Farjadrad et al. | 714/780 |
| 2006/0005105 A1 * | 1/2006 | Yoshida | 714/758 |
| 2006/0242533 A1 * | 10/2006 | Lee et al. | 714/758 |
| 2007/0011568 A1 | 1/2007 | Hocevar | |
| 2007/0022354 A1 | 1/2007 | Yu et al. | |
| 2007/0022362 A1 | 1/2007 | Yue et al. | |
| 2007/0038914 A1 * | 2/2007 | Bickerstaff et al. | 714/758 |
| 2007/0043998 A1 | 2/2007 | Lakkis | |
| 2008/0104474 A1 * | 5/2008 | Gao et al. | 714/752 |

OTHER PUBLICATIONS

International Search Report and Written Opinion of the International Searching Authority, issued for corresponding PCT Application PCT/US2009/02044, dated Jun. 4, 2009.

(Continued)

*Primary Examiner* — Guy Lamarre
(74) *Attorney, Agent, or Firm* — Kramer Levin Naftalis & Frankel LLP

(57) ABSTRACT

In exemplary embodiments of the present invention, methods and apparatus allowing for an efficient design of an LDPC decoder suitable for a range of code-block sizes and bit-rates, which is also suitable for both ASIC and FPGA implementations, are provided. In exemplary embodiments of the present invention, the overhead associated with correction data sent along the transmission channel can be minimized. In exemplary embodiments of the present invention, an LDPC decoder is suitable for both ASIC and FPGA implementations. Method and apparatus allowing for an efficient design of an LDPC decoder suitable for a range of code-block sizes and bit-rates are presented. In exemplary embodiments of the present invention, such an LDPC decoder can be implemented in both ASIC and FPGA implementations. In exemplary embodiments of the present invention such an LDPC decoder can be optimized for either eIRA based H matrices or for general H matrices, as may be desirable. In exemplary embodiments of the present invention, an H parity matrix can be constructed and/or manipulated to arrange the bit-node message "columns" to facilitate mapping to MPB "columns" and corresponding access via LUT pointer tables to minimize processing cycles so as to, for example: (i) minimize address conflicts within the same MPB that will take multiple access cycles to resolve; (ii) minimize splitting of bit-node messages across MPB "columns" that will take multiple access cycles to resolve; and (iii) balance the bit-node computations across all the MPB/LUT "columns" so that they will complete their computations at nearly the same time.

23 Claims, 16 Drawing Sheets

(56) References Cited

OTHER PUBLICATIONS

Selvarathinam, High Throughput Low Power Decoder Architectures for Low Density Parity Check Codes, Texas A&M University, Dissertation [online], Aug. 2005, (retrieved on Mar. 21, 2009), URL: http://txspace.tamu.edu/bitstream/ handle/1969.1/2529/etd-tamu-2005B-CEEN-Selvara.pdf?sequence=1.

Tong et al., An FPGA Implementation of (3, 6) Regular Low-Density Parity-Check Code Decoder, EURASIP Journal on Applied Signal Processing, artilce [online], 2003, (downloaded on May 19, 2009), pp. 530-542, downloaded from the internet URL: http://www.hindawi.com/getpdf.aspx?doi=10.1155/s1110865703212105.

Yeo et al., Architectures and Implementations of Low-Density Parity Check Decoding Algorithms, Article [online], 2002, (downloaded on May 19, 2009), downloaded from the internet URL: http://www.eecs.berkeley.edu/-ananth/2002+/ Engling/Final45thmidweat.pdf.

Lestable et al., Error Control Coding Options for Next Generation Wireless Systems, WWWRF/WG4/Subgroup on Channel Coding, White Paper [online], Oct. 18, 2006, (downloaded on May 19, 2009, downloaded from the internet URL: http://wwwmns.ifn.et.tudresden.de/staff/tavares/MT_Publications_files/WWRF_WG4_ECC_2006.pdf.

* cited by examiner

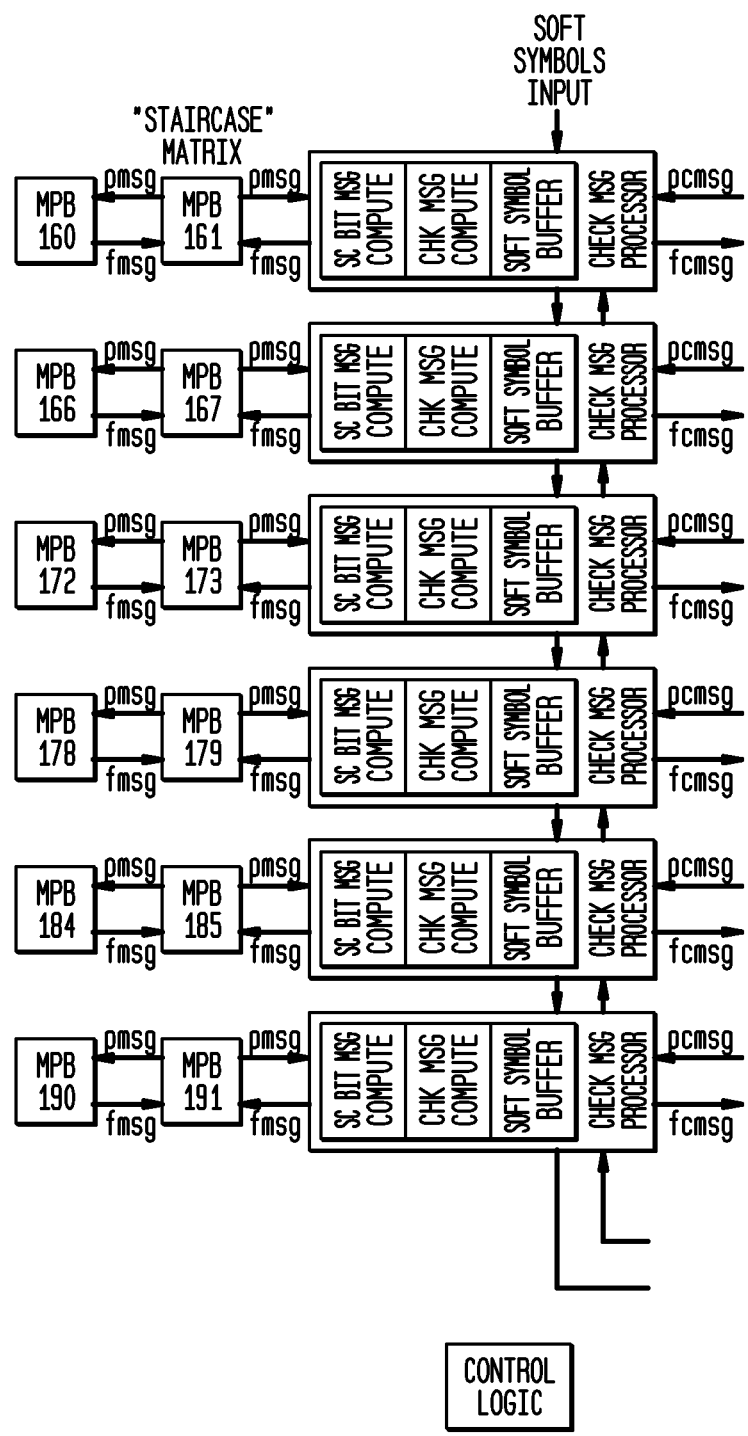

```
              "STAIRCASE"            |           "RANDOM"
        ┌                            |                              ┐
      5 │ 1 0 0 0 0 0 0 0 0 0        | 0 0 0 0 1 0 1 0 0 0 1 0 0 0 0 1 0 │
      6 │ 1 1 0 0 0 0 0 0 0 0        | 1 0 0 1 0 0 0 1 0 0 0 0 0 0 0 1 │
      6 │ 0 1 1 0 0 0 0 0 0 0        | 0 0 1 0 0 1 0 0 0 1 0 0 0 0 1 0 0 │
CHECK 6 │ 0 0 1 1 0 0 0 0 0 0        | 1 0 0 1 0 0 0 1 0 0 0 1 0 0 0 0 0 │
DEGREE 6 │ 0 0 0 1 1 0 0 0 0 0       | 0 1 0 0 0 0 0 1 0 0 0 0 1 0 1 0 │
      6 │ 0 0 0 0 1 1 0 0 0 0        | 0 0 1 0 0 0 0 0 0 1 0 0 1 1 0 0 0 │
      6 │ 0 0 0 0 0 1 1 0 0 0        | 0 0 0 0 1 0 0 1 0 0 1 0 0 0 0 0 1 │
      6 │ 0 0 0 0 0 0 1 1 0 0        | 0 1 0 0 0 1 0 0 0 1 0 0 1 0 0 0 0 │
      6 │ 0 0 0 0 0 0 0 1 1 0        | 1 0 0 1 0 0 1 0 0 0 0 1 0 0 0 0 0 │
      6 │ 0 0 0 0 0 0 0 0 1 1        | 0 0 0 0 1 0 0 0 1 0 0 0 0 1 1 0 0 │
        └                                                           ┘

BIT   2 2 2 2 2 2 2 2 2 1  3 2 2 3 3 2 2 3 2 3 2 2 2 3 2 2 2
DEGREE                                        1 1 1 1 1 1 1
         INFO BIT#  0 1 2 3 4 5 6 7 8 9 0 1 2 3 4 5 6
```

FIG. 6B

```
              "STAIRCASE"            |           "RANDOM"
        ┌                            |                              ┐
      5 │ 1 0 0 0 0 0 0 0 0 0        | 0 0 0 0 1 0 1 0 0 0 1 0 0 0 0 1 0 │
      6 │ 1 1 0 0 0 0 0 0 0 0        | 1 0 0 1 0 0 0 1 0 0 0 0 0 0 0 1 │
      6 │ 0 1 1 0 0 0 0 0 0 0        | 0 0 1 0 0 1 0 0 0 1 0 0 0 0 1 0 0 │
CHECK 6 │ 0 0 1 1 0 0 0 0 0 0        | 1 0 0 1 0 0 0 1 0 0 0 1 0 0 0 0 0 │
DEGREE 6 │ 0 0 0 1 1 0 0 0 0 0       | 0 1 0 0 0 0 0 1 0 0 0 0 1 0 1 0 │
      6 │ 0 0 0 0 1 1 0 0 0 0        | 0 0 1 0 0 0 0 0 0 1 0 0 1 1 0 0 0 │
      6 │ 0 0 0 0 0 1 1 0 0 0        | 0 0 0 0 1 0 0 1 0 0 1 0 0 0 0 0 1 │
      6 │ 0 0 0 0 0 0 1 1 0 0        | 0 1 0 0 0 1 0 0 0 1 0 0 1 0 0 0 0 │
      6 │ 0 0 0 0 0 0 0 1 1 0        | 1 0 0 1 0 0 1 0 0 0 0 1 0 0 0 0 0 │
      6 │ 0 0 0 0 0 0 0 0 1 1        | 0 0 0 0 1 0 0 0 1 0 0 0 0 1 1 0 0 │
        └                                                           ┘

BIT   2 2 2 2 2 2 2 2 2 1  3 2 2 3 3 2 2 3 2 3 2 2 2 3 2 2 2
DEGREE                                        1 1 1 1 1 1 1
         INFO BIT#  0 1 2 3 4 5 6 7 8 9 0 1 2 3 4 5 6
```

FIG. 6C

|  | MPB Col0 | MPB Col1 |  |  |  |  |  |  |  |  | MPB Col2 LUT 0 | | | | MPB Col3 LUT 1 | | | | MPB Col4 LUT 2 | | | | MPB Col5 LUT 3 | | | |
|---|---|---|---|---|---|---|---|---|---|---|---|---|---|---|---|---|---|---|---|---|---|---|---|---|---|---|
| 5 | 1 | 0 | 0 | 0 | 0 | 0 | 0 | 0 | 0 | 0 | 0 | 0 | 0 | 1 | 0 | 0 | 1 | 0 | 0 | 0 | 0 | 1 | 0 | 0 | 0 | 1 | 0 |
| 6 | 1 | 1 | 0 | 0 | 0 | 0 | 0 | 0 | 0 | 0 | 1 | 0 | 0 | 0 | 0 | 0 | 0 | 1 | 1 | 0 | 0 | 0 | 0 | 0 | 0 | 0 | 1 |
| 5 | 0 | 1 | 1 | 0 | 0 | 0 | 0 | 0 | 0 | 0 | 0 | 0 | 1 | 0 | 0 | 1 | 0 | 0 | 0 | 0 | 0 | 0 | 0 | 0 | 1 | 0 | 0 |
| 6 | 0 | 0 | 1 | 1 | 0 | 0 | 0 | 0 | 0 | 0 | 1 | 0 | 0 | 0 | 0 | 0 | 0 | 1 | 1 | 0 | 0 | 0 | 1 | 0 | 0 | 0 | 0 |
| 6 | 0 | 0 | 0 | 1 | 1 | 0 | 0 | 0 | 0 | 0 | 0 | 1 | 0 | 0 | 1 | 0 | 0 | 0 | 0 | 1 | 0 | 0 | 0 | 0 | 0 | 1 | 0 |
| 6 | 0 | 0 | 0 | 0 | 1 | 1 | 0 | 0 | 0 | 0 | 0 | 0 | 1 | 0 | 1 | 0 | 0 | 0 | 0 | 0 | 1 | 0 | 0 | 1 | 0 | 0 | 0 |
| 5 | 0 | 0 | 0 | 0 | 0 | 1 | 1 | 0 | 0 | 0 | 0 | 0 | 0 | 1 | 0 | 0 | 0 | 0 | 0 | 0 | 0 | 1 | 0 | 0 | 0 | 0 | 1 |
| 6 | 0 | 0 | 0 | 0 | 0 | 0 | 1 | 1 | 0 | 0 | 0 | 1 | 0 | 0 | 0 | 1 | 0 | 0 | 0 | 0 | 1 | 0 | 0 | 1 | 0 | 0 | 0 |
| 6 | 0 | 0 | 0 | 0 | 0 | 0 | 0 | 1 | 1 | 0 | 1 | 0 | 0 | 0 | 0 | 0 | 1 | 0 | 1 | 0 | 0 | 0 | 1 | 0 | 0 | 0 | 0 |
| 6 | 0 | 0 | 0 | 0 | 0 | 0 | 0 | 0 | 1 | 1 | 0 | 0 | 0 | 1 | 1 | 0 | 0 | 0 | 0 | 1 | 0 | 0 | 0 | 0 | 1 | 0 | 0 |

CHECK DEGREE (rows left)

BIT DEGREE: 2 2 2 2 2 2 2 2 2 1 3 2 2 3 3 2 2 2 3 2 2 2 2 2 2 2 2

INFO BIT#: 0 1 2 3 4 5 6 7 8 9 10 11 12 13 14 15 16

FIG. 6D
"COMPRESSED" PARITY MATRIX

| MPB COL | 0 | 1 | 2 | 3 | 4 | 5 |
|---|---|---|---|---|---|---|
|  | 0 | 1 | 1 | 1 | 1 | 1 |
|  | 1 | 1 | 1 | 1 | 1 | 1 |
|  | 1 | 1 | 1 | 1 | 0 | 1 |
|  | 1 | 1 | 1 | 1 | 1 | 1 |
|  | 1 | 1 | 1 | 1 | 1 | 1 |
|  | 1 | 1 | 1 | 1 | 1 | 1 |
|  | 1 | 1 | 1 | 1 | 1 | 1 |
|  | 1 | 1 | 1 | 0 | 1 | 1 |
|  | 1 | 1 | 1 | 1 | 1 | 1 |
|  | 1 | 1 | 1 | 1 | 1 | 1 |
|  | 1 | 1 | 1 | 1 | 1 | 1 |

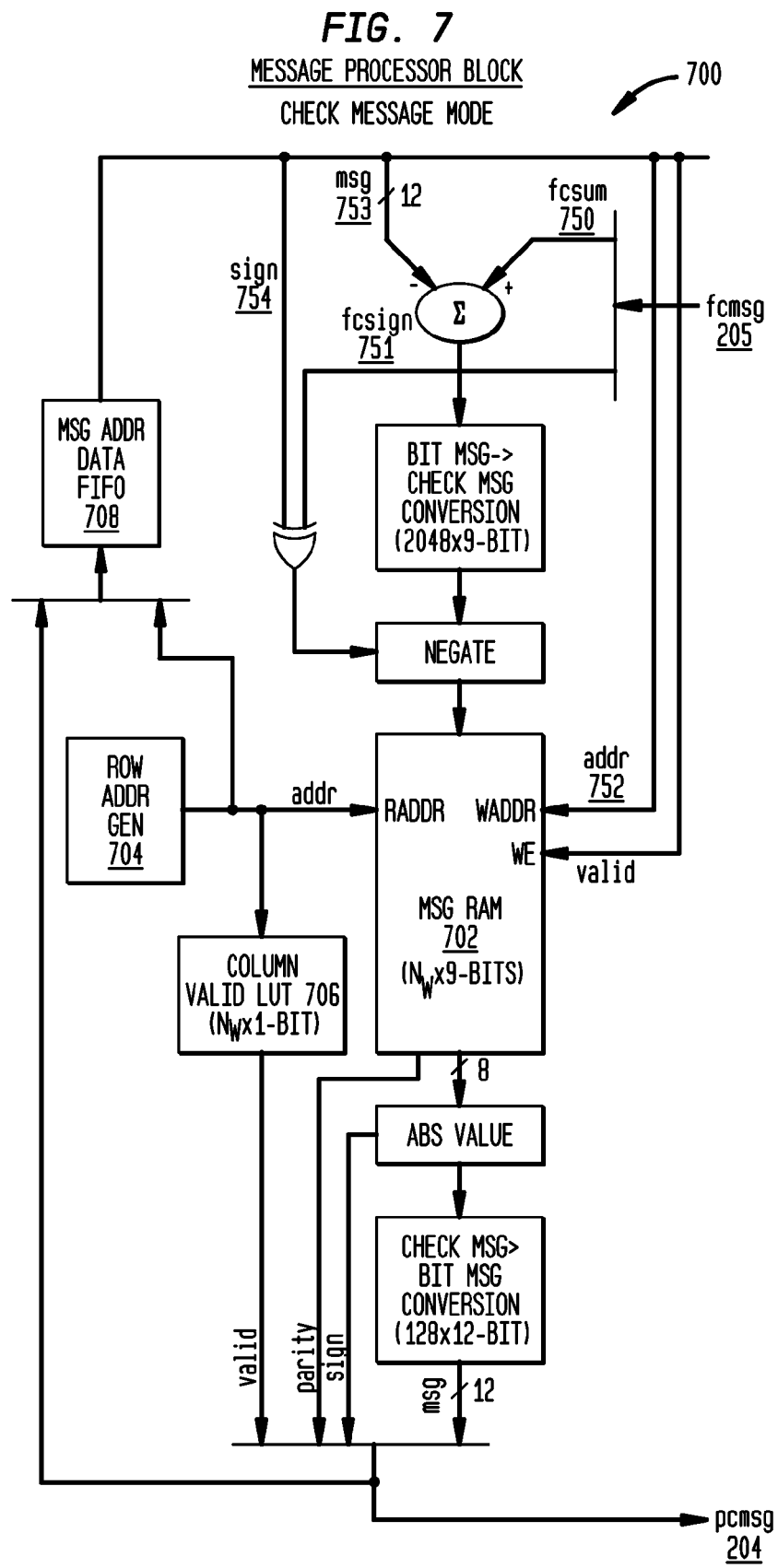

MESSAGE PROCESSOR BLOCK
BIT MESSAGE MODE

FIG. 9 ASIC ARRAY FOR LDPC DECODE

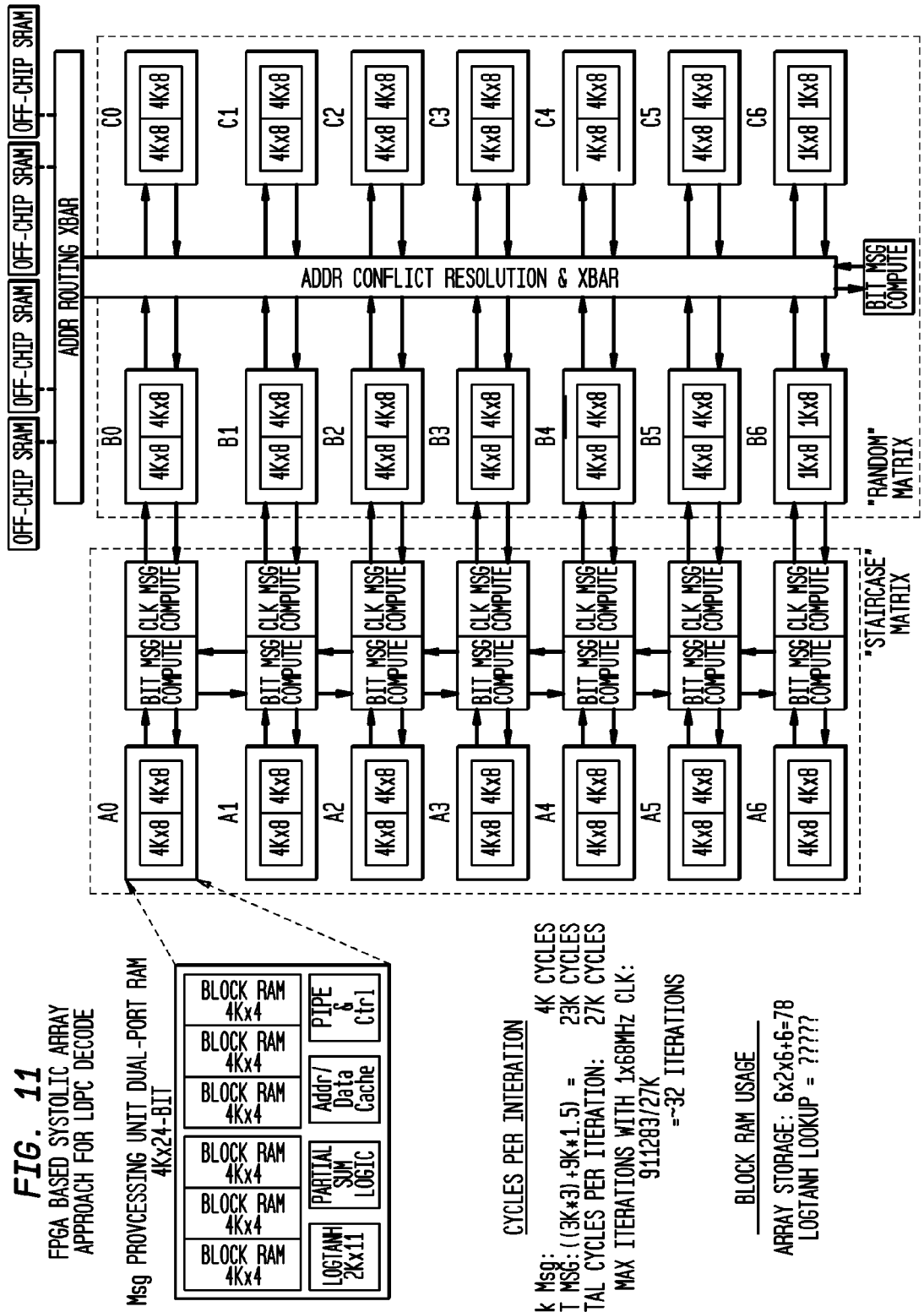

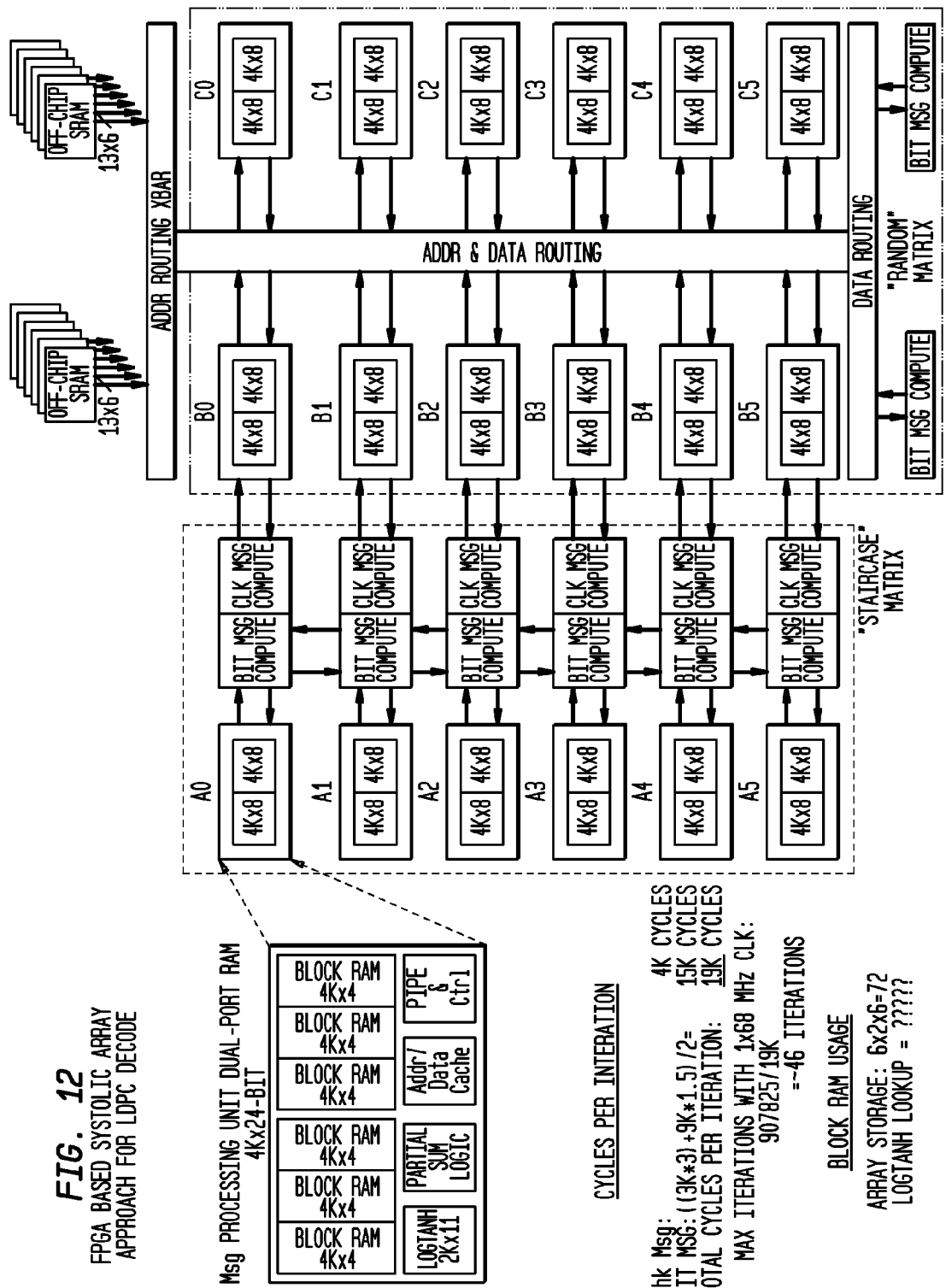

FPGA BASED SYSTOLIC ARRAY APPROACH FOR LDPC DECODE

EFFICIENT, PROGRAMMABLE AND SCALABLE LOW DENSITY PARITY CHECK DECODER

CROSS REFERENCE TO RELATED APPLICATIONS

This application claims the benefit of and hereby incorporates by reference U.S. Provisional Patent Application No. 61/072,646 entitled "EFFICIENT, PROGRAMMABLE AND SCALABLE LOW DENSITY PARITY CHECK DECODER", filed on Mar. 31, 2008.

TECHNICAL FIELD

The present invention relates to the use of forward error correction codes in communications systems, and more particularly to various systems, methods and apparatus for efficient, programmable Low Density Parity Check ("LDPC") decoders suitable for ASIC and FPGA implementation.

BACKGROUND OF THE INVENTION

In any communications system, there is always a chance that bits will be corrupted during transmission. In wireless communication systems, this problem can be especially pronounced. To address this problem, various methods of ensuring the accurate receipt of transmitted data have been developed, such as, for example, including checksums along with the data, and/or repeating portions of, or even the entire, transmission. However, for any given communication channel, there is a maximum data rate at which information can theoretically be transmitted, known as the Shannon channel limit. Any data correction information sent thus inherently detracts from actual payload data, resulting in an actual data throughput below the Shannon limit.

In a streaming-media system such as, for example, the Sirius Satellite Digital Audio Radio System ("SDARS"), it is desirable that a client device be able to decode data and correct corrupted bits at least as quickly as the data rate of the stream. Thus, It is necessary in such systems to operate in real-time, and to be able to decode and correct data at least as quickly as it is received.

Low-Density Parity Check ("LDPC") codes are a powerful Forward Error Correction ("FEC") encoding technique that allows digital communication systems to achieve performance approaching the theoretical Shannon limit. While first proposed by Robert Gallagher in 1962, the hardware design complexity and costs of implementation in many potential systems of interest have often been a barrier to practical application. Recent LDPC-based FEC designs have had a number of limitations which have limited their broader application, such as, for example, (i) small code block sizes (e.g., less than a few thousand bits), which limits the achievable FEC performance; (ii) crossbar-based approaches which limits code block size, scalability, and requires custom ASIC implementations to achieve desired performance levels; and (iii) algorithm based parity check matrices restrictions based on specific code-block size restrictions and matrix structure that facilitate hardware implementation but also limit FEC performance.

LDPC codes are linear binary systematic block codes which append M parity bits to K information (data) bits to form an N-bit codeword, where N=M+K. Generally, using an LDPC encoder, the code is defined by a sparse M×N parity check matrix H, from which a generator matrix G is derived to calculate the M parity bits from the original K information bits. Then, the N-bit codeword is transmitted to the receiver through a communications channel, which introduces noise and fading. At the other side of the communications channel, the receiver synchronizes to the transmitted stream and uses an LDPC decoder to decode the received codewords and thus recovers the K informational (data) bits of interest.

An LDPC decoder is an iterative decoder that successively iterates on the received signal to recover the original, non-corrupted information bits. The fundamental decoding principle is based on an Iterative Message Passing Algorithm ("IMPA"). The processing performed by an LDPC decoder consists of two message-passing components: (i) a Parity Check-node (also known as a "Check-node") update which updates M Check-nodes; and (ii) Bit-node update which updates N Variable (also known as a "Bit-node") nodes. During the first half iteration, each Bit-node collects information from all associated Parity Check-nodes and creates a unique message to send back to each associated Parity Check-node. During the second half iteration, each Check-node collects information from all associated Bit-nodes and creates a unique message to send back to each associated Bit-node. The precise message calculation is determined by a decoding algorithm, which can be one of several known to those skilled in the art. The message passage calculations typically employ the Extrinsic Information Principle where each node collects messages from the other involved nodes, but excludes their own information from their update calculations.

The associated elements involved in the message computations in both update phases are defined by a sparse parity check matrix H, in which each column represents codeword bit equations, and each row represents a parity check equation. The computational complexity of each iteration is affected by code-block size, Bit-node degree ($d_v$) (number of "1's" in a column) and Check-node degree ($d_c$) (number of "1's" in a row), code irregularity, specific parity check code distribution, and a number of other factors.

In general, better LDPC code performance can be achieved with large code block sizes, a random H matrix, and irregular bit node degree, but these same features typically increase decoder size and complexity, and this fact has limited practically achievable systems.

What is thus needed in the art is an LDPC decoder that can overcome the aforementioned limitations. What is further needed is an LDPC decoder optimized for extended irregular repeat accumulate ("eIRA") parity-check matrices, that can also be applicable to non-eIRA parity-check matrices in a straightforward manner.

SUMMARY OF THE INVENTION

In exemplary embodiments of the present invention, methods and apparatus allowing for an efficient design of an LDPC decoder suitable for a range of code-block sizes and bit-rates, which is also suitable for both ASIC and FPGA implementations, are provided. In exemplary embodiments of the present invention, the overhead associated with correction data sent along the transmission channel can be minimized. In exemplary embodiments of the present invention, an LDPC decoder is suitable for both ASIC and FPGA implementations. Method and apparatus allowing for an efficient design of an LDPC decoder suitable for a range of code-block sizes and bit-rates are presented. In exemplary embodiments of the present invention, such an LDPC decoder can be implemented in both ASIC and FPGA implementations. In exemplary embodiments of the present invention such an LDPC decoder can be optimized for either eIRA based H matrices or for general H matrices, as may be desirable. In exemplary embodiments of the present invention, an H parity matrix can be constructed and/or manipulated so as to arrange the bit-node message "columns" to facilitate mapping to MPB "columns" and corresponding access via LUT pointer tables to minimize processing cycles to, for example: (i) minimize address conflicts within the same MPB that will take multiple access cycles to resolve; (ii) minimize splitting of bit-node messages across MPB "columns" that will take multiple access cycles to resolve; and (iii) balance the bit-node computations across all the MPB/LUT "columns" so that they will complete their computations at nearly the same time.

BRIEF DESCRIPTION OF THE DRAWINGS

FIGS. 6A-6D depict stages in converting a sample eIRA parity-check matrix into another form according to an exemplary embodiment of the present invention;

FIG. 7 depicts an exemplary configuration and processing performed by the MPBs for check-node message processing according to an exemplary embodiment of the present invention;

FIG. 11 depicts an exemplary embodiment of the present invention optimized for FPGA implementation; and FIGS. 12 and 13 depict additional exemplary FPGA-based embodiments according to the present invention.

It is noted that the for the U.S. version of the specification, the patent or application file contains at least one drawing executed in color. Copies of this patent or patent application publication with color drawings will be provided by the U.S. Patent Office upon request and payment of the necessary fees.

DETAILED DESCRIPTION OF THE INVENTION

In exemplary embodiments of the present invention, methods and apparatus allowing for an efficient design of an LDPC decoder suitable for a range of code-block sizes and bit-rates, which is also suitable for both ASIC as well as FPGA implementations, are provided. In exemplary embodiments of the present invention, the overhead associated with correction data sent along the transmission channel can be minimized.

Figure 1B:
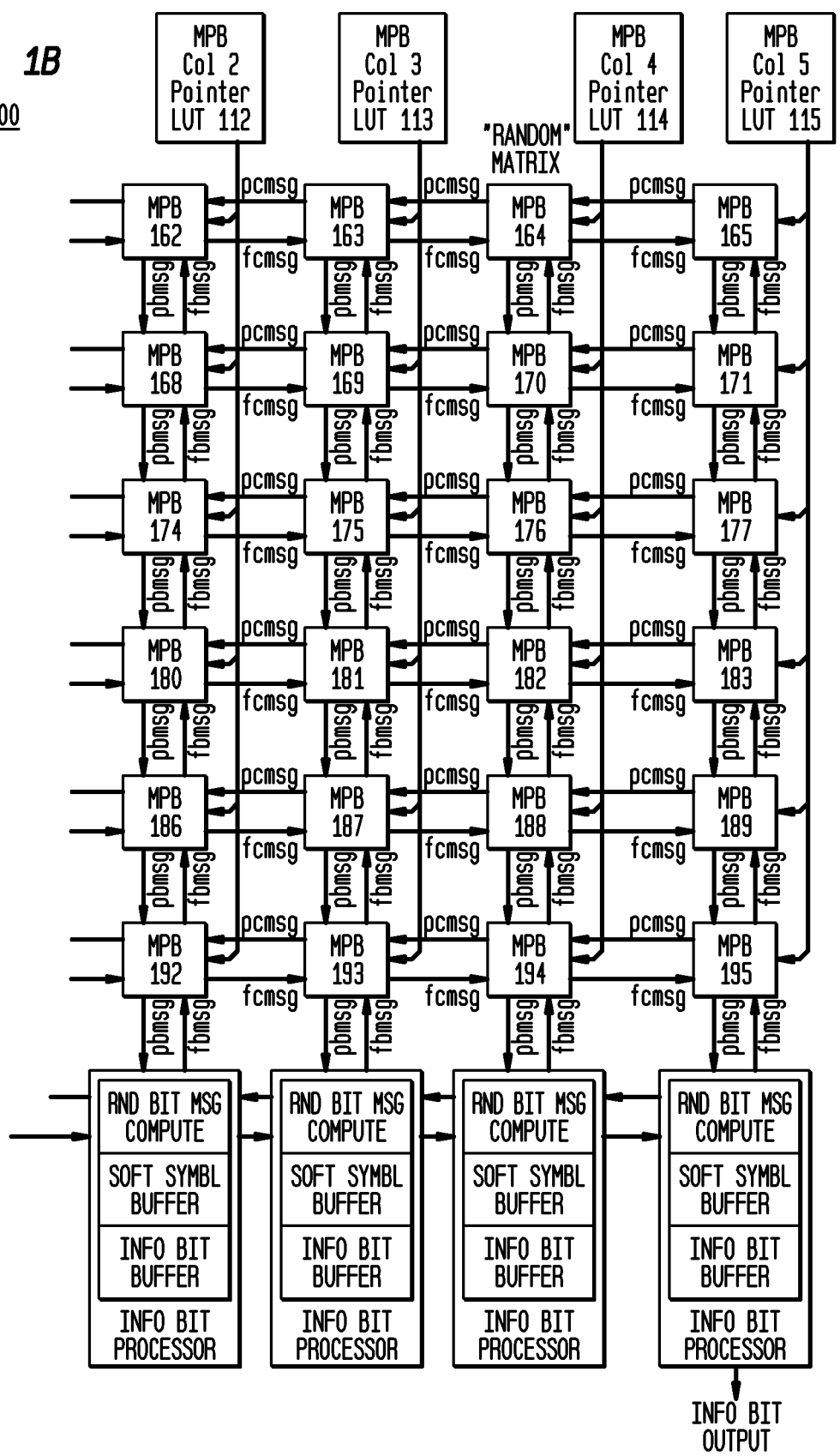
FIG. 1 depicts a schematic representation of an exemplary LDPC decoder optimized for eIRA based H matrices according to an exemplary embodiment of the present invention.
Figure 2A:
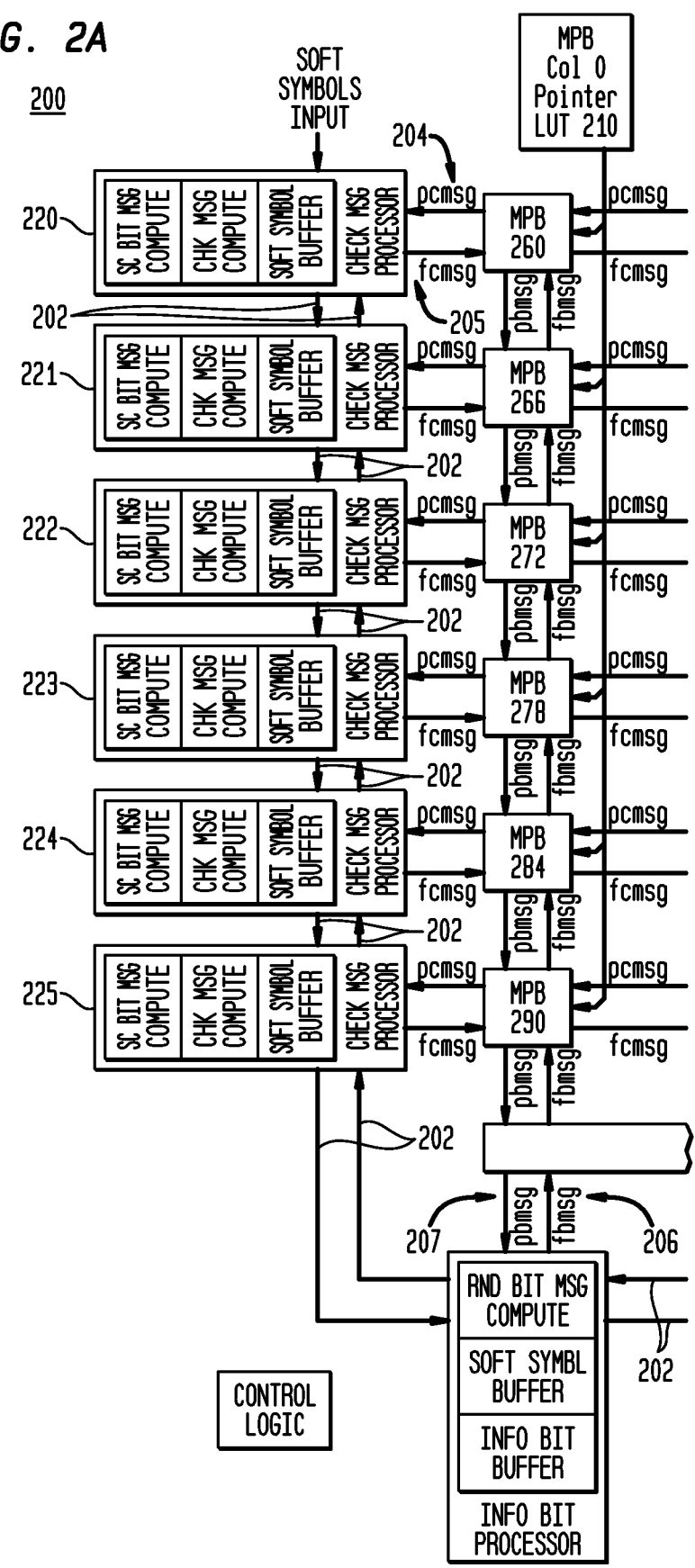
FIG. 2 depicts a schematic representation of an exemplary LDPC decoder designed for general H matrices according to an exemplary embodiment of the present invention.
Figure 2B:
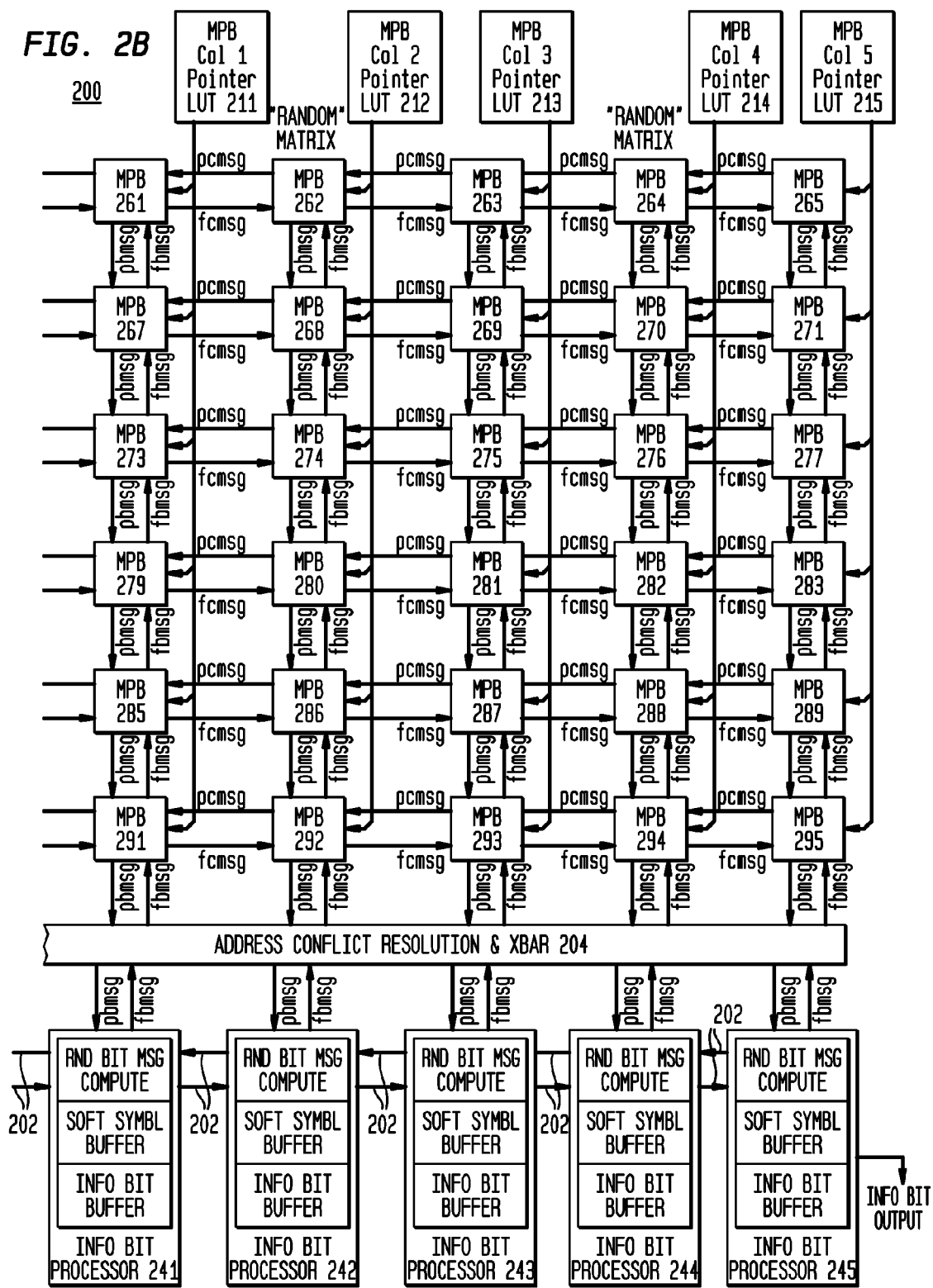

FIG. 1 depicts a schematic representation of an exemplary, optimized LDPC decoder according to an exemplary embodiment of the present invention, represented generally as 100. FIG. 2 depicts another LDPC decoder according to an exemplary embodiment of the present invention, represented generally as 200. The main distinction between decoders 100 and 200 is that whereas 200 is a more general implementation that can work with a non-eIRA parity-check matrix, 100 is an optimized implementation which can take advantage of the properties of an eIRA parity-check matrix. The individual components and functions comprising 100 and 200 are described in greater detail below.

Figure 3:
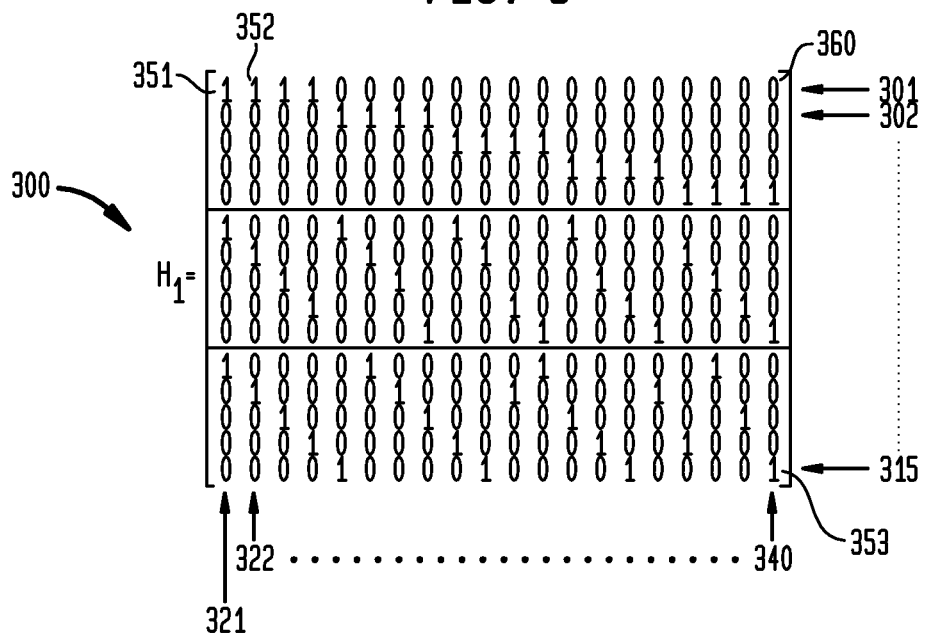
FIG. 3 depicts a sample parity-check matrix according to an exemplary embodiment of the present invention.

Prior to describing in detail the exemplary embodiments of FIGS. 1 and 2, it is worth describing some fundamentals of LDPC decoding. Now referring to FIG. 3, a sample M×N (M=15, N=20) parity check-matrix H, referred to generally as 300, is shown. As noted above, M and N are related according to the formula: N=M+K, where K is the original number of information (data) bits and M is the number of parity bits.

Referring again to FIG. 3, matrix 300 consists of 15 rows, numbered 301-315 (for clarity, numerals 303-314 are not shown), and 20 columns, numbered 321-340 (for clarity, numerals 323-339 are not shown). Each value within matrix 300 is an individual bit, represented by either a 1 or a 0.

Figure 4:
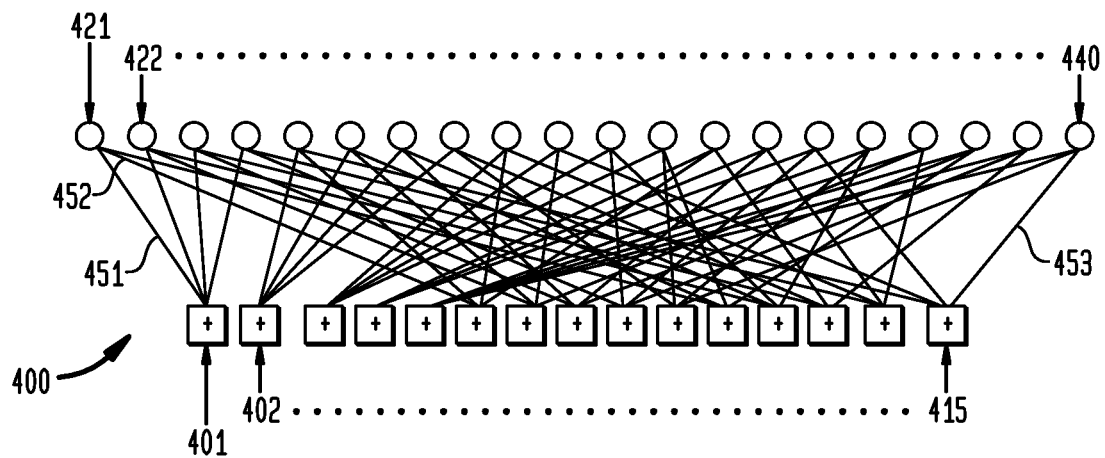
FIG. 4 depicts a Tanner Graph representation of a parity-check matrix according to an exemplary embodiment of the present invention.

With reference to FIG. 4, a tanner tree, represented generally as 400, is shown. Tanner tree 400 is a graphical representation of the information contained in matrix 300. The top nodes of the Tanner tree are Variable-Nodes, and the lower set of nodes the Check-Nodes. Check-nodes 401-415 (for clarity, numerals 403-414 are not shown) correspond to rows 301-315, and Variable-Nodes 421-440 (for clarity, numerals 423-439 are not shown) correspond to columns 321-340. For every bit in matrix 300 that is a 1, a line is drawn in tree 400 connecting the Check-node and Variable-Node that correspond to the row and column in matrix 300. For example, line 451 corresponds to bit 351; line 452 corresponds to bit 352; and line 453 corresponds to bit 353. Where a bit in matrix 300 is a 0, no line is drawn in tree 400. For example, there is no line drawn between Check-node 401 and Variable-node 440, because the corresponding bit 360 in matrix 300 is 0.

Equation 1 below illustrates a typical half iteration Bit-node update using the Extrinsic Information Principle, where: $b_n(i)$ is the bit-message associated with the $i^{th}$ populated bit in the $n^{th}$ column of matrix 300, $c_n(j)$ is the check message associated with the $j^{th}$ populated bit in the $n^{th}$ column of matrix 300, and $r_n$ is the original intrinsic (received) information associated with the $n^{th}$ bit node. The bit messages are computed for all $i \in [1:d_v]$ bit nodes in the $n^{th}$ column of matrix 300.

$$b_n(i) = r_n + \left[\sum_{j=1}^{d_v} c_n(j)\right] - c_n(i) \qquad \text{Equation 1}$$

Figure 5:
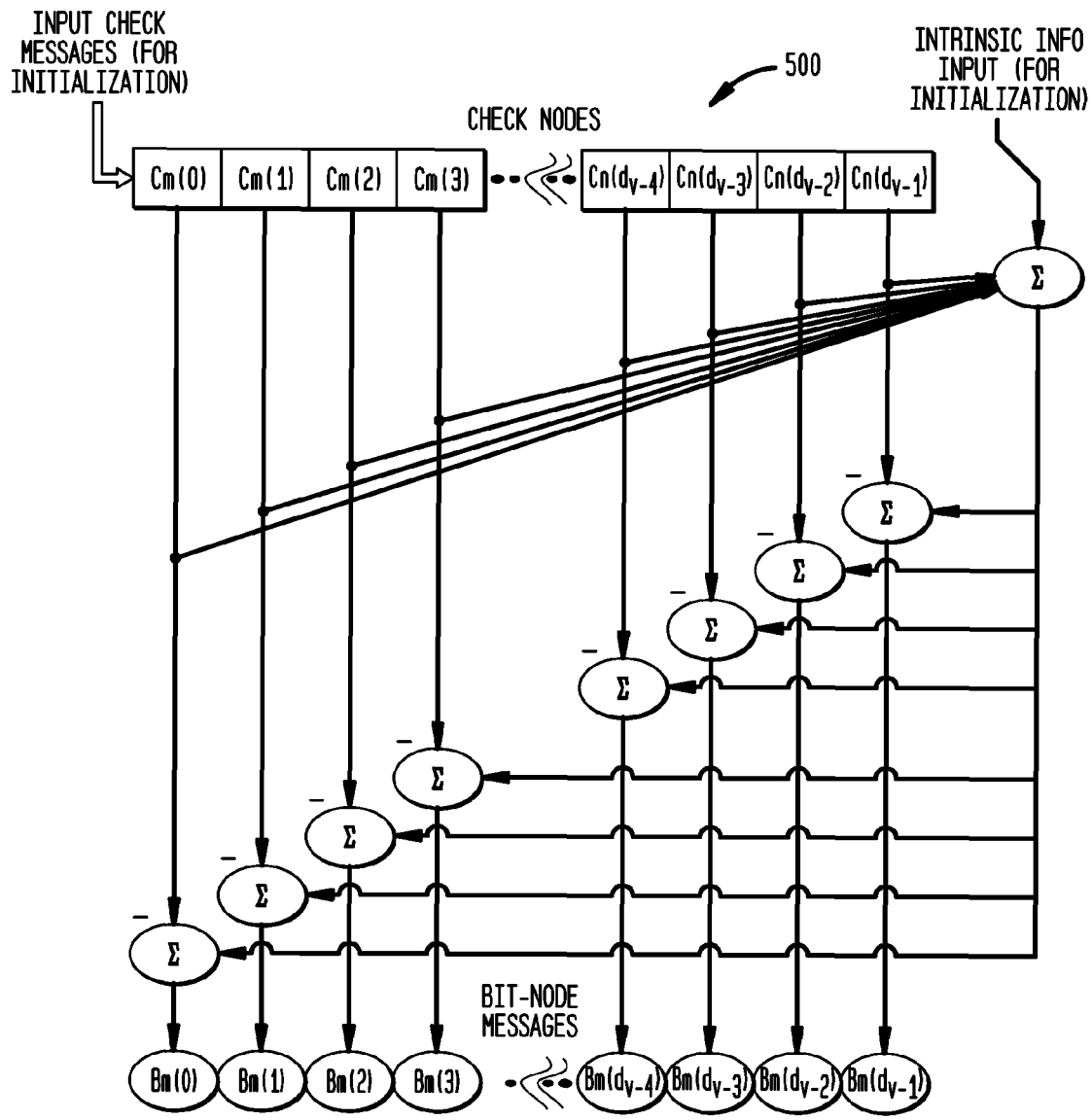
FIG. 5 depicts the operations involved in decoding a received signal according to an exemplary embodiment of the present invention.

Referring to FIG. 5, system 500 graphically represents the message processing algorithm of Equation 1. As can be appreciated by one skilled in the art, as the dimensions of N and M become large (on the order of 5000 or more), the large number of nearly random accesses of the Bit (Variable)-nodes and Check-nodes can create a connection routing and/or memory access bottleneck, thus limiting processing performance and increasing hardware implementation complexity. System 500 also illustrates the sheer number of computations that can, for example, need to be performed for large codeword sizes.

FIGS. 6A-6D illustrate a novel compression technique for compressing a parity check matrix H to facilitate mapping the parity information onto an exemplary embodiment of the present invention. FIG. 6A depicts 10×27 matrix 600, a sample H matrix, before compression. Exemplary matrix 600 is in eIRA format, comprising of an initial staircase section followed by a section of random data. With matrix 600 in eIRA format, it becomes possible to use the exemplary eIRA optimized LDPC decoder 100. Otherwise, if matrix 600 were not in eIRA format, generalized LDPC decoder 200 can be used.

Along the left side of matrix 600, the Check degree ($d_c$) for each row is displayed; along the bottom of matrix 600, the Bit degree ($d_v$) for each column is displayed. Each column of the random section is numbered, labeled as the Info BIT #, from 0-16 (the tens place digit appearing above the ones place digit, when used).

With reference to FIG. 2, LDCP Decoder Array 200 comprises a series of lookup-table memories ("LUT") 210-215. Generally, an H matrix with maximum check-node degree $d_c$ would require at least $d_c$ Message Processing Blocks (MPB) "columns" for efficient Bit-node message processing. In exemplary embodiments of the present invention, there can be, for example, as many MPB "columns" as the maximum check degree value for any row in matrix 600.

LDCP Decoder Array 200 has six MPB "columns" and can support a parity check matrix H with a check degree up to six (6). In exemplary embodiments of the present invention, the number of MPB "rows" for efficient Check-node message processing can be determined, for example, by examining variable (bit) node degree $d_v$ distribution, the H matrix "compression" mapping, and degree of parallelism required for the target decoder performance. For example, LDCP Decoder Array 200 has six MPB "rows" and can, depending on the particular matrix, compute bit degrees up to six (6) within each "column" per access cycle, bit degrees up to 12 within two access cycles and so on.

Access conflicts within the MBP or between columns can add access cycles to complete the bit-node message computation and should be minimized with the matrix "compression" mapping.

With reference to FIG. 6B, matrix 600 is examined, and each set bit being marked to be mapped to one of LUTs 210-215, as indicated by the color coding in FIG. 6B (for those unable to see the colors, for each row in matrix 600 in FIG. 4B a different color is used for each 1 bit, in such a way that no column has more than one color of bits; thus cols. 0-2 have orange 1-bits, cols. 3, 8, 9 and 10 have blue, cols. 5, 6, 7 and 13 have maroon, and cols. 11, 12 and 14-16 have purple). The bits are flagged such that, after being rearranged, only one bit per row will map to a given LUT.

Now referring to FIG. 6C, some columns of matrix 600 have been rearranged to form matrix 601. The columns are, for example, arranged so as to group all orange bits to be within the same group of adjacent columns (cols. 0, 1, 2 and 4—assigned to LUT 0); all maroon bits to be within the same group of adjacent columns (cols. 5, 6, 7 and 13—assigned to LUT 1); and so on for blue (cols. 3, 8, 9 and 10—assigned to LUT 2) and purple bits (cols. 11, 12 and 14—16—assigned to LUT 3).

In the general case, this mapping process can occur for the entire matrix 600. In the case of an eIRA matrix 600 which has an initial staircase section, a simplified algorithm for the staircase section can be implemented. Simply, the diagonal lines of the green (upper diagonal line) and magenta (lower diagonal line) bits can be directly mapped to LUTs 210 and 211.

Compressed parity matrix 602, depicted in FIG. 6D, can then, for example, be built. Matrix 602 has the same M rows as matrix 600, but only has as many columns as there are LUTs. For each row segment of each LUT in matrix 601, if a bit is set to 1, the corresponding bit in matrix 602 is set to 1. Due to the exemplary method discussed above for creating matrix 601 (shown in FIG. 6C), there is generally at most one bit set per row segment. In the case of a row segment where no bit is set, the corresponding bit in matrix 602 can be set to 0, as seen in each of columns 3 and 4 of FIG. 6D.

When compressing matrix 601 (FIG. 6C) into matrix 602 (FIG. 6D), information on which bits in a given column are set to 1 can, for example, be stored in the corresponding LUT. The information for each LUT for matrix 600 is provided in Table 1 below.

TABLE 1

| LUT | Info BIT # | Row(s) |
|---|---|---|
| 210 | $i \in [0:9]$ | $\{i\}$ |
| 211 | $j \in [0:8]$ | $\{j + 1\}$ |
| 212 | 0 | 1, 3, 8 |
|  | 1 | 4, 7 |
|  | 2 | 2, 5 |
|  | 4 | 0, 6, 9 |
| 213 | 13 | 2, 7 |
|  | 5 | 0, 8 |
|  | 6 | 1, 3 |
|  | 7 | 4, 5, 9 |
| 214 | 3 | 1, 3, 8 |
|  | 8 | 4, 9 |
|  | 9 | 5, 7 |
|  | 10 | 0, 7 |
| 215 | 11 | 3, 8 |
|  | 12 | 5, 7 |
|  | 14 | 2, 9 |
|  | 15 | 0, 4 |
|  | 16 | 1, 6 |

The information in Table 1 is derived directly from the original bit locations in matrix 600, according to a 0-based counting scheme. For example, there is a 1-bit in Info BIT column 4, row 0 (top row) of original matrix 600, that was tagged orange. In Table 1, this is mapped to LUT 212. Similarly, the 1-bit at Info BIT column #10, row 0 (tagged blue). In Table 1, this is mapped to LUT 214. For brevity, the individual bits related to the staircase section are not individually enumerated.

Now referring to FIG. 2, the information from Table 1 can be loaded into LUTs 210-215. FIG. 2 shows the two-dimensional partitioning of the LDPC matrix processing mapped to an array of MPBs 260-295 that provide distributed storage of the parity check message memory and distributed computation of the Check-node and Bit-node messages. In exemplary embodiments of the present invention, this allows, for example, highly parallel access of message storage and message computation for high-throughput LDPC processing. The Check Message Processors (CMPs) 220-225 can, for example, collect Check Messages from the MPBs and distribute final Check-node message sums back to the MPBs to complete their Check message computation. The Info Bit Message Processor blocks (BMPs) 230-235 can, for example, similarly collect Bit-node Messages from the MPBs and distribute final Bit-node message sums back to the MPBs to complete their Bit-node message computation. The CMPs 220-225 and BMPs 240-245 (these labeled as "INFO BIT Processor's in FIG. 2) can, for example, respectively contain Soft Symbol buffers 226-231 and 246-251, and BMPs 240-245 can contain Info Bit buffers 252-257 so that the next codeword can, for example, be loaded, and the previous codeword's computed info bits can, for example, be output while the current codeword is being decoded. The signal busses 202 interconnecting the CMPs and BMPs can have, for example, multiplexed functionality for inter-block communication and soft symbol/info bit input/output functions. The LUT memories 210-215 can, for example, hold the bit-node message memory access pointers required for computing the bit messages on a column basis. They can specify, for example, for a given bit message column computation, which message location within a particular MPB is involved in the bit-node message summation. If no location within the MPB is required, then, for example, a null pointer location can be specified and the MPB need not be involved in such computation cycle, and thus contributes zero to the sum. In exemplary embodiments of the present invention, an Address Conflict Resolution and Crossbar Block 204 can, for example, be provided to allow bit message computation requiring contributions from more that one MPB "column". Crossbar Block 204 can be optionally used, depending on the particular mapping of the parity matrix to the MPB array.

In exemplary embodiments of the present invention, processing efficiency can, for example, be improved with certain restrictions and manipulations. An H parity matrix can, for example, be constructed and/or manipulated to facilitate mapping to an exemplary proposed decoder architecture. The goal is to arrange the bit-node message "columns" to facilitate mapping to the MPB "columns" and corresponding access via LUT pointer tables to minimize processing cycles to, for example: (i) minimize address conflicts within the same MPB that will take multiple access cycles to resolve; (ii) minimize splitting of bit-node messages across MPB "columns" that will take multiple access cycles to resolve; and (iii) balance the bit-node computations across all the MPB/LUT "columns" so that they will complete their computations at nearly the same time.

In exemplary embodiments of the present invention, memory organization can be optimized for Row access. It is assumed that the degree of the Check nodes is nearly Regular, meaning that there are the same number of associated Variable nodes with each Check node. This allows for a neat rectangular organization of the memory, which is the length of the number of Check nodes (M) and the width of the highest Check node degree ($d_c$). This can, for example, provide simple access to all the associated messages for each Check node update. The total processing time for the Check nodes is determined by how many MPB rows are instantiated.

In exemplary embodiments of the present invention, there can be two optimizations for the column processing. With the rectangular memory organization, the number of distinct columns can, for example, be determined by the Check-node degree. If the matrix is, for example, built in a uniform fashion, the Variable nodes can, for example, be grouped by the Check-node degree. This means that all the associated Check-nodes for the $j^{th}$ group of Variable nodes are all confined to the $j^{th}$ column of message memory, simplifying memory access. If the Check-node degree is not fully Regular, then there are a small number of unused memory locations. These memory locations can, for example, be used to eliminate any need to access messages across columns, making each MPB column processing independent of the others. In addition, if the associated Check-nodes of a particular Variable-node are selected in coordination with the number MPB rows being utilized, the number of cycles required to complete the Variable node update can be minimized.

LDPC Decoder Array Computation Modes

In exemplary embodiments of the present invention, the LDCP Decoder Array 200 can have three distinct modes of operation, depending on the function being performed.

Initialization:

The soft symbol values for the new codeword can, for example, be loaded into the soft symbol buffers of the CMPs and BMPs. The CMPs and BMPs can, for example, compute an initial noise variance of the soft symbol data and distribute them to initialize the MBP message memories via the FCMSG and FBMSG buses.

Check Mode Processing:

The message passing in this mode is "horizontal" when viewing the array configuration. For a given check-node computation, the contributing messages can be accessed simultaneously across the MPB "row." In exemplary embodiments of the present invention the MPB can, for example, compute a partial message and send via the PCMSG bus (partial check-message bus), represented generally as 204, to the CMP which can, for example, collect all of the partial check messages and can, for example, compute the final check-message sum (fcsum) and sign (fcsign), and distribute it back to the MBPs via the FCMSG bus (final check-node message bus), represented generally as 205. In exemplary embodiments of the present invention the MBP can use the FCMSG information to compute the update to its contributing check-node message memory. In exemplary embodiments of the present invention, for check-node processing, the array can, for example, be accessed in any order; preferably it can be accessed sequentially since this allows simple counters for address generation. In exemplary embodiments of the present invention $N_r$ check-node updates can occur simultaneously (one in each MBP "row") with $N_r \times N_c$ simultaneous message memory accesses and updates. In exemplary embodiments of the present invention message passing and computation can be pipelined so that stages of multiple check-node updates can be in process simultaneously to achieve $N_r$ complete check-node updates per clock/access cycle. In exemplary embodiments of the present invention LDCP Decoder Array 200 can provide for six (6) check-node updates and 36 message memory updates occur simultaneously with each clock cycle; however, due to the parallel nature of the invention, alternate exemplary embodiments can be implemented which can allow for fewer or greater numbers of simultaneous operations.

Bit Mode Processing:

In exemplary embodiments of the present invention the message passing in this mode can be "vertical" when viewing the array configuration. For a given bit-node computation, the contributing messages can be, for example, accessed simultaneously across the MPB "column". In exemplary embodiments of the present invention the MPB computes the partial message and sends via the PBMSG bus, (partial bit-message bus) to the BMP which collects all the partial bit messages and computes the final bit-message sum (fbsum) and parity (fbparity), and distributes it back to the MBPs via the FBMSG bus (final bit-node message bus). In exemplary embodiments of the present invention the MBP uses the FBMSG information to compute the update to its contributing bit-node message memory. For bit-node processing the array can be accessed in any order and is determined by optimization of the LUT pointer tables. $N_c$ bit-node updates can occur simultaneously (one in each MBP "column") with up to $N_c \times N_r$ simultaneous message memory accesses and updates. Message passing and computation can be pipelined so that stages of multiple bit-node updates can be in process simultaneously to achieve up to $N_c$ complete bit-node updates per clock/access cycle. For the example illustrated, six (6) bit-node updates and 36 message memory updates can occur simultaneously with each clock cycle. In exemplary embodiments of the present invention each LUT pointer memory can supply $N_r$ individual message pointer addresses to the MPBs within its "column". Large degree bit-nodes ($d_v > N_r$) or situations where address conflicts occur (such that require access multiple locations within an MBP's message memory or involve MBPs in multiple "columns") require more than one access-cycle to read/write the messages contributing to the bit-node computation. Normally, in exemplary embodiments of the present invention, an array can, for example, be sized to minimize the multi-access-cycle bit-node computations so that the bit-node compute mode timeline can be, for example, dominated by the single-access cycle bit-node computations.

In exemplary embodiments of the present invention a decoder can, for example, continue to iterate the Check Mode processing and Bit Mode processing steps, until the CMPs, which are monitoring and decoding the parity information from the bit-node computations, can determine the decoder has converged to the original information bits, or some other exit criteria, such as, for example, if a race condition is detected.

Message Processing Block Architecture

In exemplary embodiments of the present invention, a Message Processing Block is one of the key elements of an exemplary LDPC decoder, providing message memory storage, check-node and bit-node computation elements. A two-dimensional array of MBPs can provide an exemplary LDPC decoder with a high degree of distributed parallel message memory access and message update computation, allowing it to achieve high performance decoding. The MPB is an efficient regular block, with regular port connectivity, which again facilitates its implementation in an FPGA or ASIC. In exemplary embodiments of the present invention the MPB's elements can, for example, assume two distinct configurations depending on the compute mode. In either case, the design provides a simple method of applying the Extrinsic Information Principle, which is known to be key to several decoding algorithms. The Extrinsic Information Principle deals with the exclusion of information originating from a particular node when new messages are created. In exemplary embodiments of the present invention the MPB architecture can handle this step locally, minimizing the complexity of the external message calculations.

Now referring to FIG. 7, exemplary configuration and processing performed by the MPBs for check-node message processing is displayed. The MPB is referred to generally as 700, and is representative of each of MPB 160-195 and MPG 260-295. In exemplary embodiments of the present invention Message RAM memory 702 can be organized as $N_w \times 9$-bits; where depth $N_w \geq M/N_r$, and can be, for example, a power of 2 for ease of implementation. In exemplary embodiments of the present invention the memory can be narrower than 9-bits, but this will typically reduce the $E_b/N_o$ performance of the LDPC decoder. In exemplary embodiments of the present invention the memory can be read via an address supplied by the Row Address Generator 704, which can, for example, be a simple counter or a more complicated source, depending on the H matrix and implementation details. In exemplary embodiments of the present invention Column Valid LUT 706 decodes the read address to determine if there is a valid connection to the check-node in the corresponding memory location. In exemplary embodiments of the present invention Column Valid LUT 706 can, for example, be a memory (RAM or ROM), address decoder logic, an algorithmic address decoder, or other logic without loss of generality. In exemplary embodiments of the present invention the message value can be read from memory, mapped into Log(tan h(x)) space, and appended with numerical sign, parity, and valid information bits and formatted to be sent via PCMSG bus 204 to the corresponding CMP. In exemplary embodiments of the present invention the CMP can collect all the contributing partial check messages from the participating MPBs, and can, for example, distribute back to them the formatted final check-node message via FCMSG signal bus 205. In exemplary embodiments of the present invention the MPB saves the PCMSG data and corresponding memory address in a FIFO memory (Message Address/Data FIFO) 708 which can, for example, be utilized to complete the message memory update (via the Extrinsic Information exclusion principle) when the corresponding fcsum 750 and fcsign 751 information is available from the CMP via FCMSG signal bus 205. In exemplary embodiments of the present invention the FIFO depth is dependent on the maximum round-trip clock-cycle delay from the MPB to the CMP and back. When the final check-node message from the CMP is a available on the FCMSG signal bus 205, the corresponding message address 752 and data 753 information can be, for example, read from the FIFO 708. In exemplary embodiments of the present invention the message data 753 contribution can be subtracted from fcsum 750 and mapped back to linear data space through a $(Log(tan\ h(x)))^{-1}$ transform, which can be, for example, a look-up table/ROM. In exemplary embodiments of the present invention original message sign 754 and final sign (fcsign) 751 can be, for example, used to adjust the final sign of the message written back to the message memory location.

Figure 8:
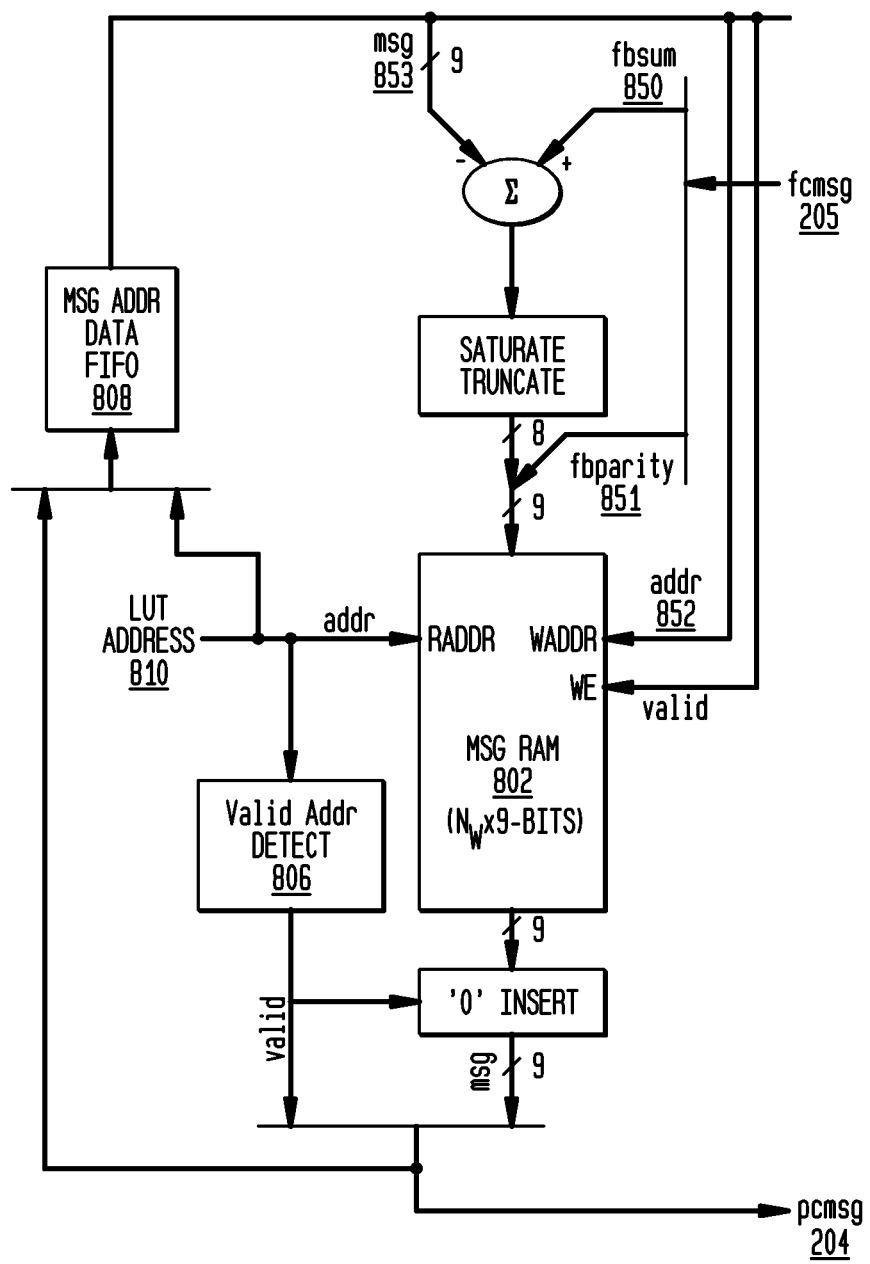
FIG. 8 depicts an exemplary configuration and processing performed by the MPBs for bit-node message processing according to an exemplary embodiment of the present invention.

Now referring to FIG. 8, exemplary configuration and processing performed by the MPBs for bit-node message processing is displayed. The MPB is referred to generally as 800, and is representative of each of MPB 160-195 and MPG 260-295. In exemplary embodiments of the present invention the memory can be read via an address supplied by the corresponding LUT Pointer Memory 810, which can, for example, be a RAM or ROM memory, logic based decoder, or algorithmic address generator, depending on the H matrix and implementation details. In exemplary embodiments of the present invention, Valid Address Detect logic 806 can qualify the LUT address as valid (either by an explicit address valid signal from the LUT 810 or by detecting a null (unused) address pointer value. If valid, the message value can be read, for example, from memory 802 and appended with valid information bits and formatted to be sent via PBMSG bus 204 to the corresponding BMP. In exemplary embodiments of the present invention BMP collects all the contributing partial bit messages from the participating MPBs, and distributes back to them the formatted final bit-node message via the FBMSG signal bus 205. In exemplary embodiments of the present invention MPB saves the PBMSG data and corresponding memory address in a FIFO memory (Message Address/Data FIFO) 808 which can be, for example, utilized to complete the message memory update (via the Extrinsic Information exclusion principle) when the corresponding fbsum 850 and fbparity 851 information is available from the BMP via FBMSG signal bus 205. In exemplary embodiments of the present invention the FIFO depth can be dependent on the maximum round-trip clock-cycle delay from the MPB to the BMP and back. When the final bit-node message from the BMP is available on the FBMSG signal bus 205, the corresponding message address 852 and data information 853 can, for example, be read from the FIFO 808. In exemplary embodiments of the present invention the message data contribution can be subtracted from fbsum 850 and can be written back to the message memory location along with fbparity 851, the computed bit-node parity bit.

Figure 9:
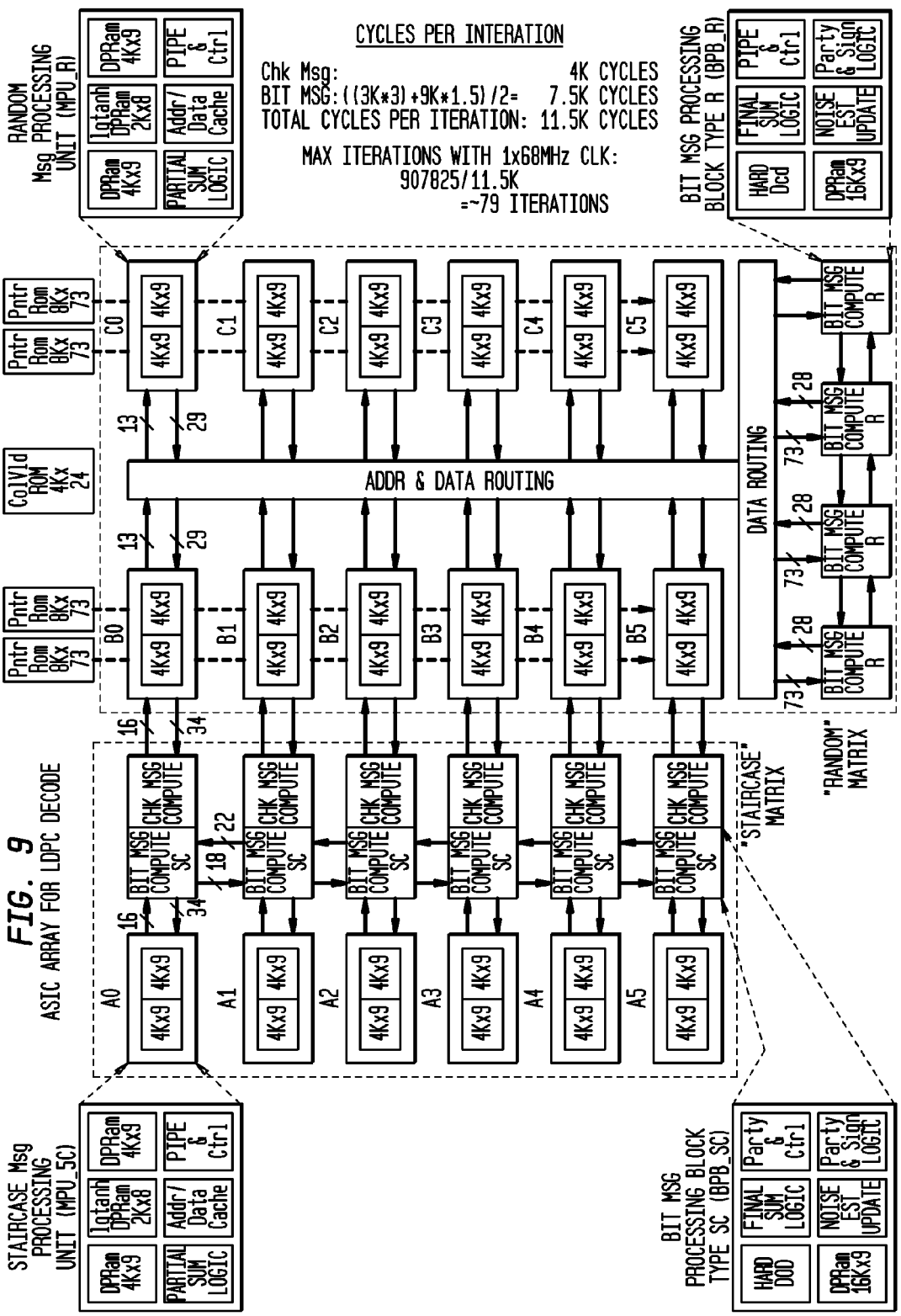
FIG. 9 depicts an exemplary embodiment of the present invention optimized for ASIC implementation.

Now referring to FIG. 9, an exemplary embodiment of the present invention optimized for ASIC implementation is shown. In the left panel of FIG. 9, there are a series of boxes shaded in gray labeled "CHK MSG Compute", which are analogous to the "CHK MSG Compute" sections of CMPs 220-225. In the right panel of FIG. 9, there are two rectangular boxes shaded in gray, shaped and aligned so as to form an upside-down "T" shape. The vertical box is labeled "Addr & Data Routing"; the horizontal box is labeled "Data Routing".

As with LDCP Decoder Array 200, the exemplary embodiment of the present invention depicted in FIG. 9 can be optimized for a parity check matrix H which contains a staircase section. Staircase Msg Processing Units (MPU_SCs) A0-A5 can, for example, be dedicated to processing data over the staircase section of H. Similarly, Random Msg Processing Units (MPU_Rs) B0-B5 and C0-C5 can be dedicated to processing data over the randomized section of H. In FIG. 9, symbolic representations of the components comprising MPU_SCs A0-A5, MPU_Rs B0-B5 and C0-C5, and Bit MSG Processing Blocks Type SC (BPB_SCs) and Bit MSG Processing Blocks Type R (BPB_Rs) are also shown. The Addr & Data Routing block, and the Data Routing block, enable the two columns of MPU_Rs (B0-B5 and C0-C5) to operate on a parity check matrix H with more than two columns of randomized data. In the exemplary embodiment displayed in FIG. 9, with four BPB_Rs, the system can, for example, be optimized for operating on a parity check matrix H with four columns of randomized data.

Figure 10:
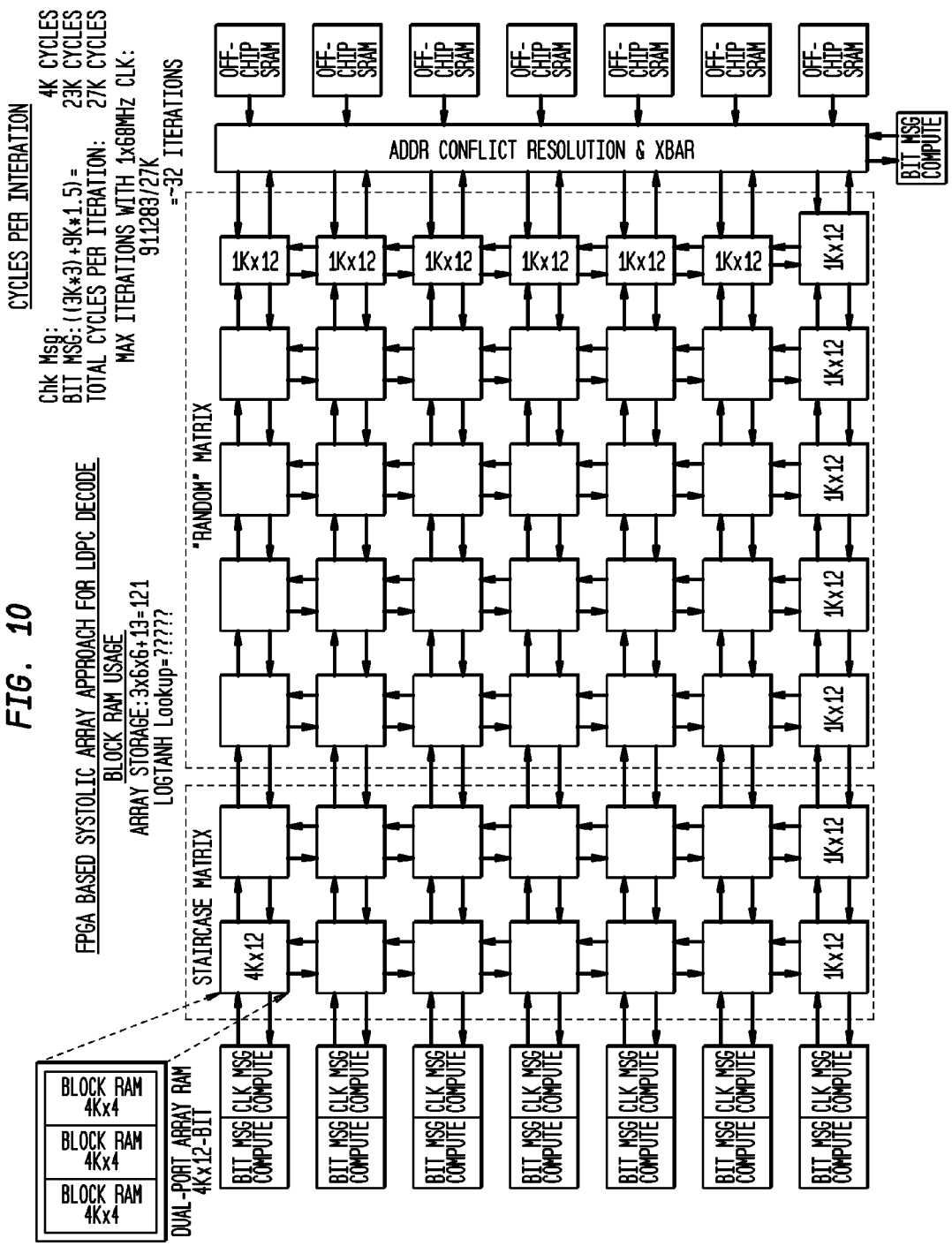
FIG. 10 depicts an exemplary preferred memory configuration for an FPGA-Based exemplary embodiment of the present invention.

Now referring to FIG. 10, an exemplary preferred memory configuration for an FPGA-Based embodiment according to the present invention is shown. In the left side of FIG. 10, there are a series of boxes shaded in gray labeled "CHK MSG Compute". In the right side of FIG. 10, there is a vertical block labeled "Addr Conflict Resolution & XBAR."

Continuing with reference to FIG. 10, each MPB contains its own local memory storage. Specifically, 4K 12-bit memory spaces. For each column and each row in the LDCP Decoder Array, an additional 1K×12-bit memory can, for example, be used for storage and transfer of data. The Addr Conflict Resolution & XBAR can, for example, communicate with memory, preferably off-chip SRAM, for storage and retrieval of data in excess of what can be stored within the LDCP Decoder Array's various memories.

Now referring to FIG. 11, an exemplary embodiment of the present invention optimized for FPGA implementation is shown. In the left panel of FIG. 11, there are a series of boxes shaded in gray labeled "CHK MSG Compute". In and above the right panel of FIG. 11, there are two boxes shaded in gray, shaped and aligned so as to form a "T" shape. The vertical box is labeled "Addr Conflict Resolution & XBAR"; the horizontal box is labeled "Addr Routing XBAR".

The components comprising the Msg Processing Units (MPUs), analogous to the MPBs, are shown. In this exemplary embodiment, each MPU is 4k×24-bit memory, compared with the 12-bit memory of other implementations. Having twice the memory can, for example, allow for each MPU to compute against two columns of the parity check matrix H per clock cycle instead of just one. The Addr Conflict Resolution & XBAR can allow MPUs B0-B5 and C0-C5 to operate on multiple columns over multiple clock cycles. The Addr Routing XBAR allows storage and retrieval of data in excess of what can be stored within the LDCP Decoder Array's various memories.

Figure 13A:
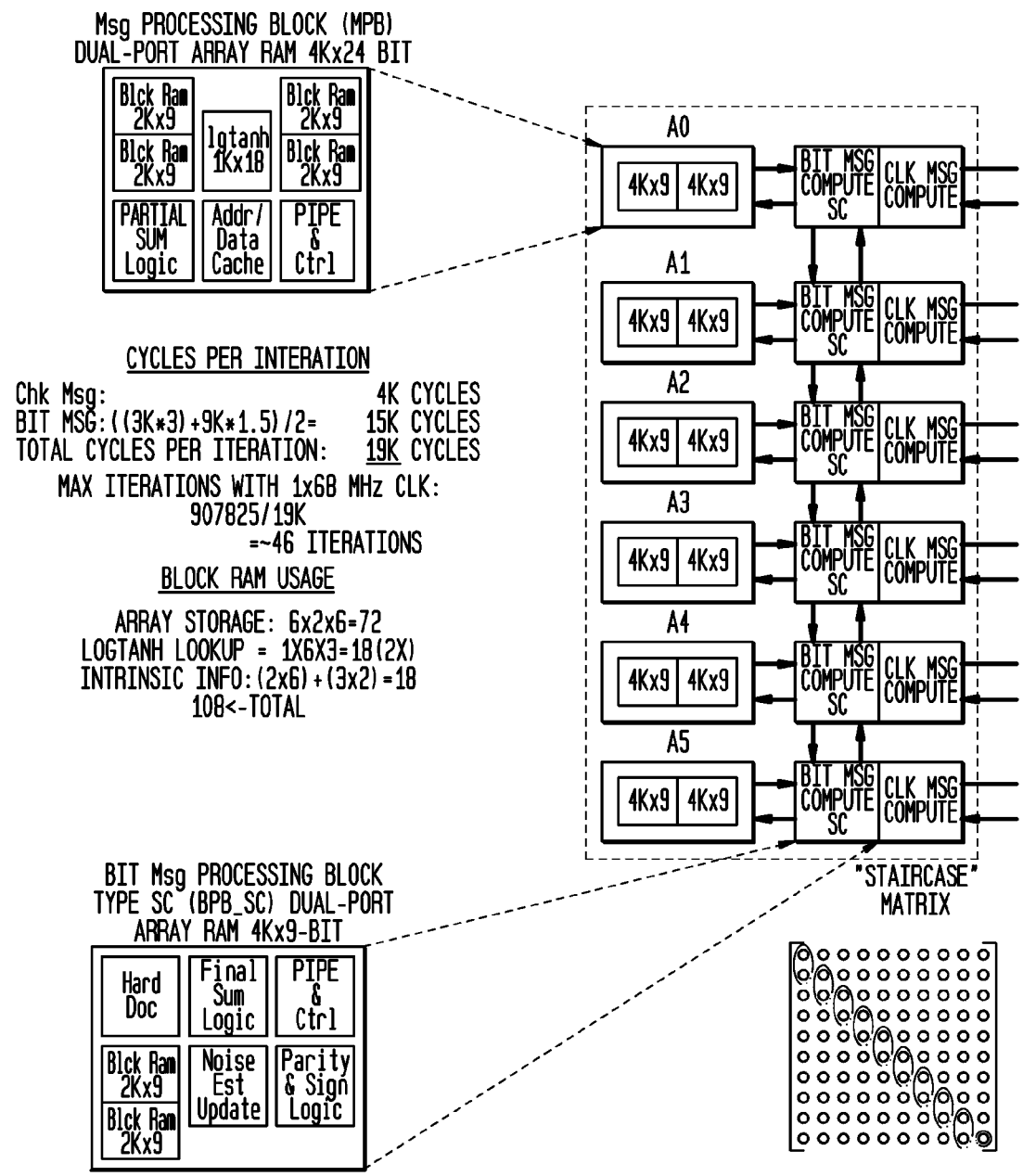
Figure 13B:
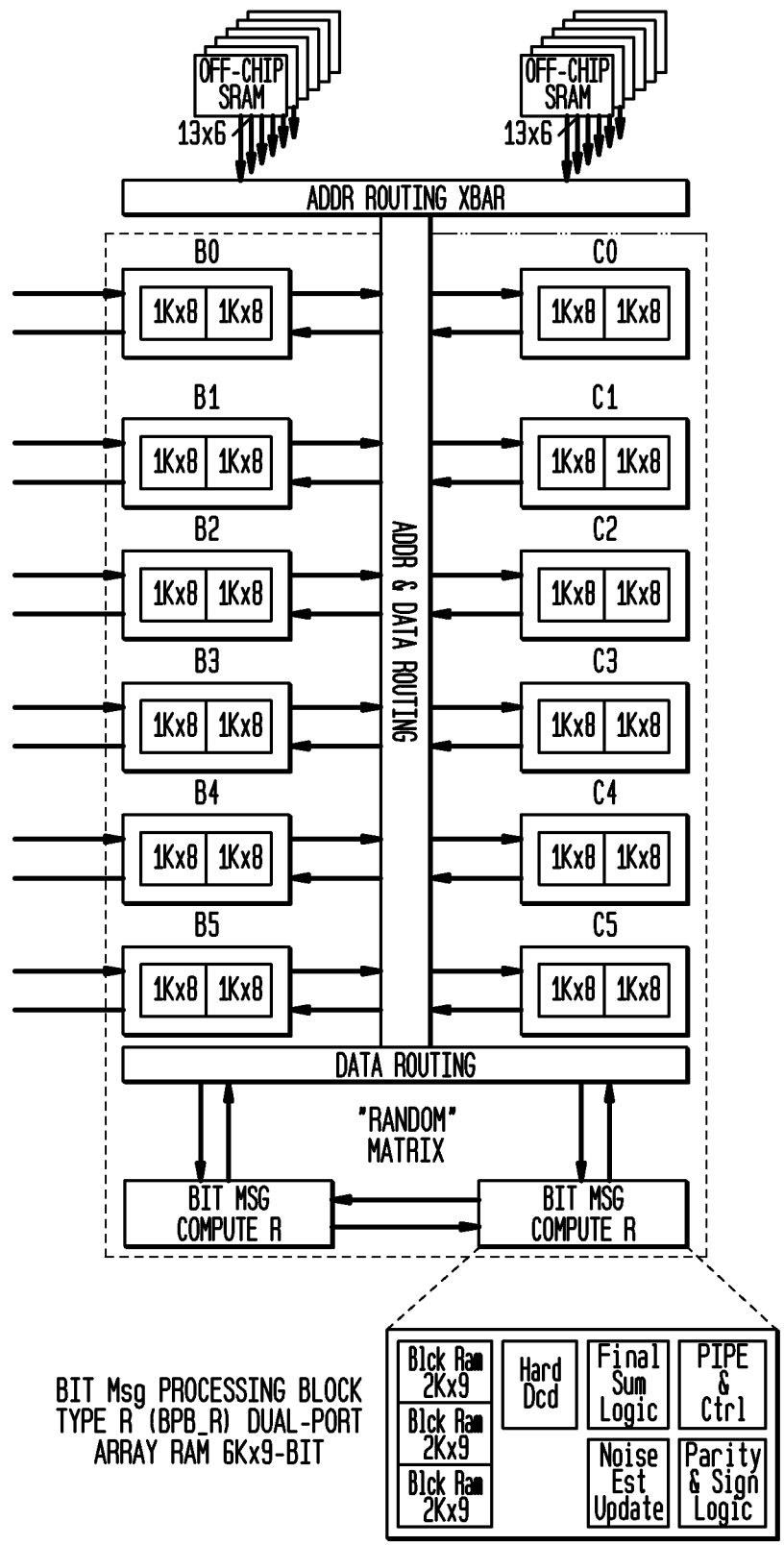

Now referring to FIGS. 12-13, an additional exemplary FPGA-based embodiment is shown. In the left panels of each of FIG. 12-13, there are a series of boxes shaded in gray labeled "CHK MSG Compute". In and above the right panels of FIG. 12-13, there are three boxes shaded in gray, shaped and aligned so as to form a "T" shape. The vertical box in each of FIG. 12-13 is labeled "Addr & Data Routing"; the top horizontal box in each of FIG. 12-13 is labeled "Addr Routing XBAR"; the bottom horizontal box in each of FIG. 12-13 is labeled "Data Routing". The main differences between these two embodiments relate to the structure of the processing units. The MPUs of FIG. 13, as compared to the MPBs of FIG. 12, additionally contain information that maps data to LOG-TANH-space.

While the present invention has been described with reference to a variety of certain exemplary embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed:

1. A low density parity check decoder comprising:
a plurality of message processing blocks arranged in a logical array;
a plurality of information bit processors, one for each column of said message processing blocks ("MPBs") in said logical array;
a plurality of lookup table memories, one for each column of said message processing blocks in said logical array; and
a plurality of check message processors, one for each row of said message processing blocks in said logical array, wherein said decoder iteratively operates to decode a data signal, and
wherein the array of message processing blocks provides distributed storage of parity check message memory and distributed computation of check-node and bit-node messages, so as to facilitate highly parallel access of message storage and message computation for high-throughput LDPC processing.

2. The decoder of claim 1 wherein said message processing blocks, information bit processors, and lookup table memories are implemented in an ASIC.

3. The decoder of claim 1 wherein said message processing blocks, information bit processors, and lookup table memories are implemented in a FPGA.

4. The decoder of claim 1, wherein said check message processors collect check messages from the MPBs and distribute final check-node message sums back to the MPBs to complete their check message computation.

5. The decoder of claim 1, wherein the info bit message processor blocks collect bit-node messages from the MPBs and distribute final bit-node message sums back to the MPBs to complete their bit-node message computation.

6. The decoder of claim 1, wherein the check message processors and the information bit processors respectively contain soft symbol buffers, and information bit buffers so that a next codeword can be loaded, and a previous codeword's computed information bits can be output while a current codeword is being decoded.

7. The decoder of claim 1, further comprising signal busses interconnecting the check message processors and bit information processors, said busses having multiplexed functionality for inter-block communication and soft symbol/information bit input/output functions.

8. The decoder of claim 1, wherein the lookup table memories hold bit-node message memory access pointers required for computing bit messages on a column basis.

9. The decoder of claim 8, wherein said bit-node message memory access pointers specify, for a given bit message column computation, which message location within a particular MPB is involved in the bit-node message summation.

10. The decoder of claim 9, wherein if no location within the MPB is required, then a null pointer location can be specified and the MPB contributes zero to the sum.

11. The decoder of claim 1, further comprising an address conflict resolution and crossbar block, arranged to allow bit message computation requiring contributions from more that one MPB "column."

12. A low density parity check decoder optimized for a parity check matrix in eIRA format comprising:
  a plurality of message processing blocks arranged in a logical array;
  a plurality of information bit processors, one for all but two columns of said message processing blocks in said logical array;
  a plurality of lookup table memories, one for all but two columns of said message processing blocks in said logical array; and
  a plurality of check message processors, one for each row of said message processing blocks in said logical array;
  wherein said decoder iteratively operates to decode an original data signal, and
  wherein the array of message processing blocks provides distributed storage of parity check message memory and distributed computation of check-node and bit-node messages, so as to facilitate highly parallel access of message storage and message computation for high-throughput LDPC processing.

13. The decoder of claim 12, wherein said message processing blocks, information bit processors, and lookup table memories are in an ASIC.

14. The decoder of claim 12, wherein said message processing blocks, information bit processors, and lookup table memories are implemented in a FPGA.

15. The decoder of claim 12, wherein said check message processors collect check messages from the MPBs and distribute final check-node message sums back to the MPBs to complete their check message computation.

16. The decoder of claim 12, wherein the info bit message processor blocks collect bit-node messages from the MPBs and distribute final bit-node message sums back to the MPBs to complete their bit-node message computation.

17. The decoder of claim 12, wherein the check message processors and the information bit processors respectively contain soft symbol buffers, and information bit buffers so that a next codeword can be loaded, and a previous codeword's computed information bits can be output while a current codeword is being decoded.

18. The decoder of claim 12, further comprising signal busses interconnecting the check message processors and bit information processors, said busses having multiplexed functionality for inter-block communication and soft symbol/information bit input/output functions.

19. The decoder of claim 12, wherein the lookup table memories hold bit-node message memory access pointers required for computing bit messages on a column basis.

20. The decoder of claim 19, wherein said bit-node message memory access pointers specify, for a given bit message column computation, which message location within a particular MPB is involved in the bit-node message summation.

21. The decoder of claim 20, wherein if no location within the MPB is required, then a null pointer location can be specified and the MPB contributes zero to the sum.

22. A method of increasing processing efficiency in an LDPC decoder, comprising:
  providing a plurality of message processing blocks arranged in a logical array;
  providing a plurality of information bit processors, one for each column of said message processing blocks ("MPBs") in said logical array;
  providing a plurality of lookup table memories, one for each column of said message processing blocks in said logical array; and
  providing a plurality of check message processors, one for each row of said message processing blocks in said logical array,
  operating the decoder iteratively to decode a data signal, wherein the array of message processing blocks provides distributed storage of parity check message memory and distributed computation of check-node and bit-node messages.

23. The method of claim 22,
further comprising at least one of:
(i) the check message processors and the information bit processors are respectively provided with soft symbol buffers and information bit buffers so that a next codeword can be loaded, and a previous codeword's computed information bits can be output while a current codeword is being decoded,
(ii) the check message processors collect check messages from the MPBs and distribute final check-node message sums back to the MPBs to complete their check message computation, and
(iii) the info bit message processor blocks collect bit-node messages from the MPBs and distribute final bit-node message sums back to the MPBs to complete their bit-node message computation.

* * * * *

UNITED STATES PATENT AND TRADEMARK OFFICE
CERTIFICATE OF CORRECTION

| | |
|---|---|
| PATENT NO. | : 8,601,342 B2 |
| APPLICATION NO. | : 12/384127 |
| DATED | : December 3, 2013 |
| INVENTOR(S) | : Richard Gerald Branco et al. |

It is certified that error appears in the above-identified patent and that said Letters Patent is hereby corrected as shown below:

In the Drawings

On Sheet 8 of 16, please delete FIG. 6D and replace it with the following new FIG. 6D as shown on the attached sheet.

Signed and Sealed this
Fifteenth Day of September, 2015

Michelle K. Lee
*Director of the United States Patent and Trademark Office*

FIG. 6C

|  | MPB Col0 | MPB Col1 | MPB Col2 LUT 0 | | | | MPB Col3 LUT 1 | | | | MPB Col4 LUT 2 | | | | MPB Col5 LUT 3 | | | |
|---|---|---|---|---|---|---|---|---|---|---|---|---|---|---|---|---|---|---|
| 5 | 1 0 0 0 0 0 0 0 0 0 | | 0 | 0 | 0 | 1 | 0 | 0 | 1 | 0 | 0 | 0 | 0 | 1 | 0 | 0 | 1 | 0 |
| 6 | 1 1 0 0 0 0 0 0 0 0 | | 1 | 0 | 0 | 0 | 0 | 0 | 0 | 1 | 1 | 0 | 0 | 0 | 0 | 0 | 0 | 1 |
| 5 | 0 1 1 0 0 0 0 0 0 0 | | 0 | 0 | 1 | 0 | 0 | 1 | 0 | 0 | 0 | 0 | 0 | 0 | 0 | 0 | 1 | 0 |
| 6 | 0 0 1 1 0 0 0 0 0 0 | | 1 | 0 | 0 | 0 | 0 | 0 | 0 | 1 | 1 | 0 | 0 | 0 | 1 | 0 | 0 | 0 |
| 6 | 0 0 0 1 1 0 0 0 0 0 | | 0 | 1 | 0 | 0 | 1 | 0 | 0 | 0 | 0 | 1 | 0 | 0 | 0 | 0 | 1 | 0 |
| 6 | 0 0 0 0 1 1 0 0 0 0 | | 0 | 0 | 1 | 0 | 1 | 0 | 0 | 0 | 0 | 0 | 1 | 0 | 0 | 1 | 0 | 0 |
| 5 | 0 0 0 0 0 1 1 0 0 0 | | 0 | 0 | 0 | 1 | 0 | 0 | 0 | 0 | 0 | 0 | 0 | 1 | 0 | 0 | 0 | 1 |
| 6 | 0 0 0 0 0 0 1 1 0 0 | | 0 | 1 | 0 | 0 | 0 | 1 | 0 | 0 | 0 | 0 | 1 | 0 | 0 | 1 | 0 | 0 |
| 6 | 0 0 0 0 0 0 0 1 1 0 | | 1 | 0 | 0 | 0 | 0 | 0 | 1 | 0 | 1 | 0 | 0 | 0 | 1 | 0 | 0 | 0 |
| 6 | 0 0 0 0 0 0 0 0 1 1 | | 0 | 0 | 0 | 1 | 1 | 0 | 0 | 0 | 0 | 1 | 0 | 0 | 0 | 1 | 0 | 0 |

CHECK DEGREE (left axis)

BIT DEGREE: 2 2 2 2 2 2 2 2 2 1  3 2 2 3  3 2 2 2  3 2 2 2  2 2 2 2

INFO BIT#: 0 1 2 3 4 5 6 7 8 9 10 11 12 13 14 15 16

FIG. 6D
"COMPRESSED" PARITY MATRIX

| MPB COL | 0 | 1 | 2 | 3 | 4 | 5 |
|---|---|---|---|---|---|---|
| | 0 | 1 | 1 | 1 | 1 | 1 |
| | 1 | 1 | 1 | 1 | 1 | 1 |
| | 1 | 1 | 1 | 1 | 0 | 1 |
| | 1 | 1 | 1 | 1 | 1 | 1 |
| | 1 | 1 | 1 | 1 | 1 | 1 |
| | 1 | 1 | 1 | 1 | 1 | 1 |
| | 1 | 1 | 1 | 0 | 1 | 1 |
| | 1 | 1 | 1 | 1 | 1 | 1 |
| | 1 | 1 | 1 | 1 | 1 | 1 |
| | 1 | 1 | 1 | 1 | 1 | 1 |